(12) United States Patent  
Hasegawa

(10) Patent No.: US 6,937,514 B2  
(45) Date of Patent: Aug. 30, 2005

(54) SEMICONDUCTOR MEMORY DEVICE INCLUDING MOS TRANSISTORS EACH HAVING A FLOATING GATE AND A CONTROL GATE

(75) Inventor: Takehiro Hasegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 10/647,242

(22) Filed: Aug. 26, 2003

(65) Prior Publication Data

US 2004/0212008 A1 Oct. 28, 2004

(30) Foreign Application Priority Data

Apr. 25, 2003 (JP) .................................... 2003-122811

(51) Int. Cl.[7] ........................ G11C 16/04; H01L 29/788
(52) U.S. Cl. .......................... 365/185.12; 365/185.11; 257/316
(58) Field of Search ........................ 365/185.12, 185.1, 365/185.11; 257/316, 315

(56) References Cited

U.S. PATENT DOCUMENTS

| | | | | |
|---|---|---|---|---|
| 6,115,287 A | * | 9/2000 | Shimizu et al. | 365/185.17 |
| 6,169,307 B1 | | 1/2001 | Takahashi et al. | 257/315 |
| 6,255,155 B1 | * | 7/2001 | Lee et al. | 438/222 |
| 6,630,707 B1 | * | 10/2003 | Shinmori | 257/315 |
| 6,807,096 B2 | * | 10/2004 | Toda | 365/185.03 |
| 6,853,029 B2 | * | 2/2005 | Ichige et al. | 257/316 |

OTHER PUBLICATIONS

W–H. Liu, et al., Non–Volatile Semiconductor Memory Workshop 4.1, pp. 1–3, "A 2–Transistor Source–Select (2TS) Flash EEPROM for 1.8V–Only Applications", 1997.

* cited by examiner

*Primary Examiner*—Son Mai  
(74) *Attorney, Agent, or Firm*—Oblon, Spivak, McClelland, Maier & Neustadt, P.C.

(57) ABSTRACT

A semiconductor memory device includes a plurality of memory cells, a memory cell array, bit lines, word lines, select gate lines, a column decoder, a first row decoder, a second row decoder, and first metal wiring. The memory cell includes a first MOS transistor with a charge accumulation layer and a control gate and a second MOS transistor connected to the first MOS transistor. The memory cell array has the memory cells arranged in a matrix. The word line connects commonly the control gates in the same row. The select gate line connects commonly the gates of the second MOS transistors in the same row. The first metal wiring layers are provided for every select gate lines, and pass through almost the central part of the memory cells. The first metal wiring layer is connected electrically to one of the select gate lines.

30 Claims, 35 Drawing Sheets

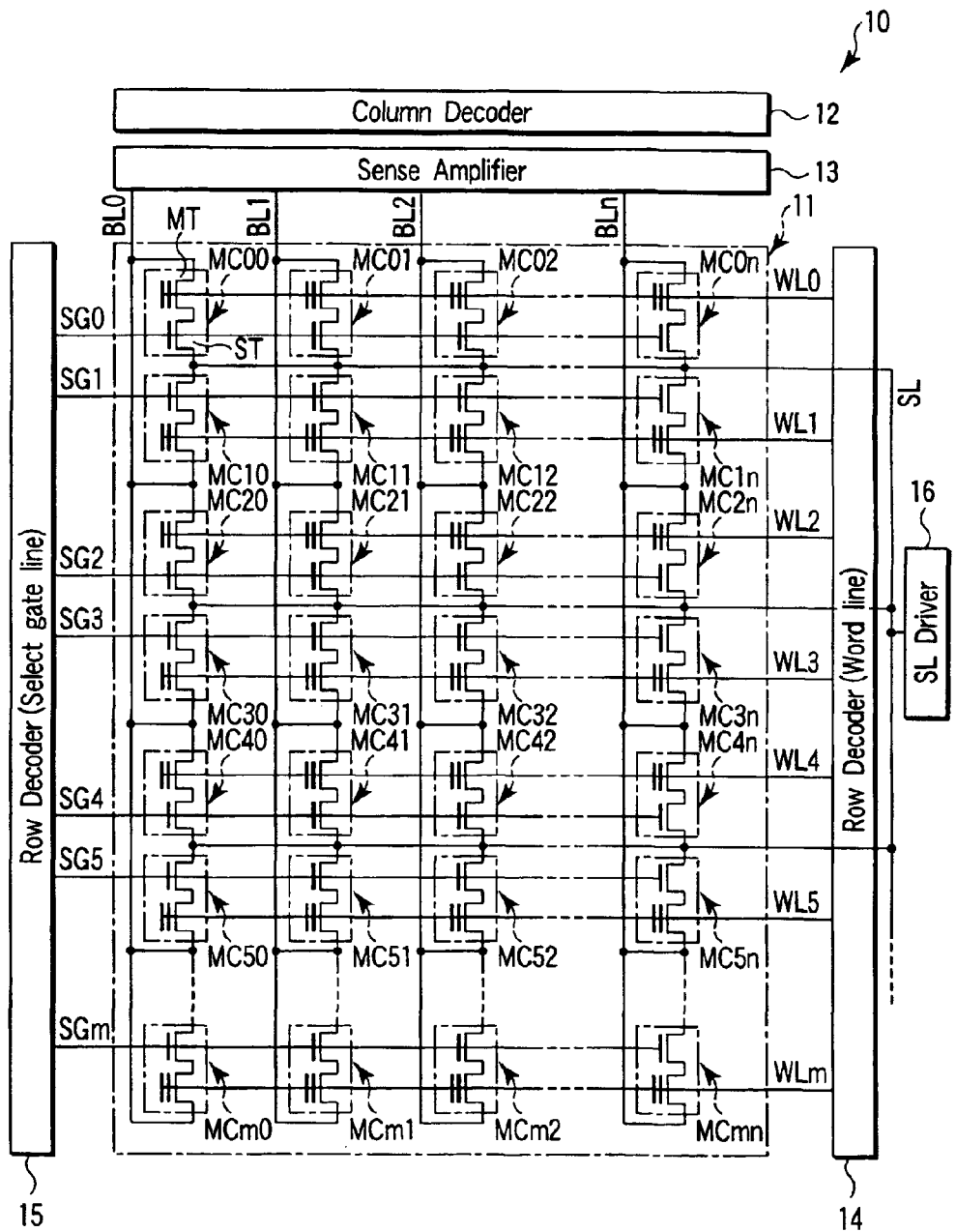
F I G. 1

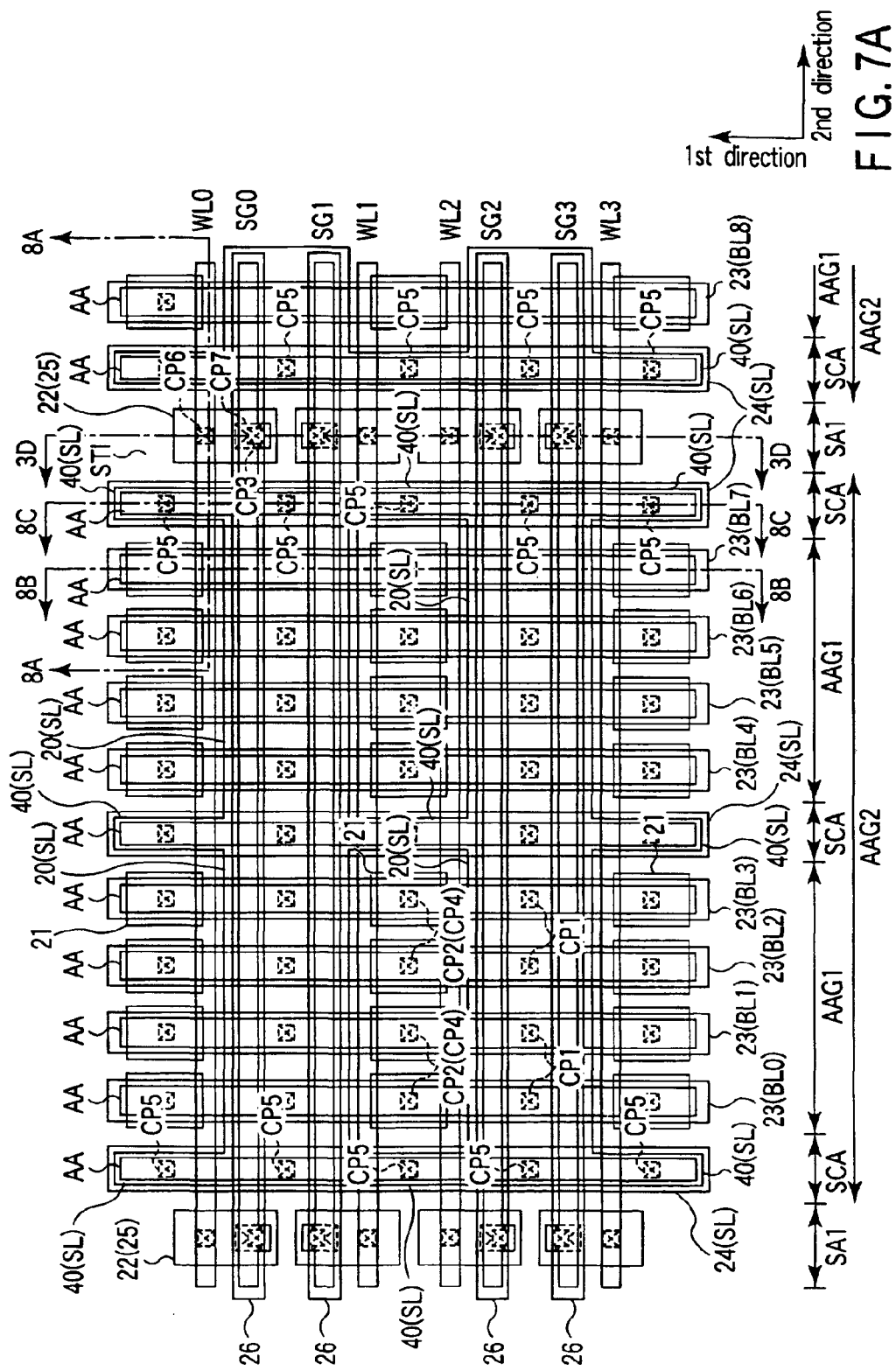
F I G. 7A

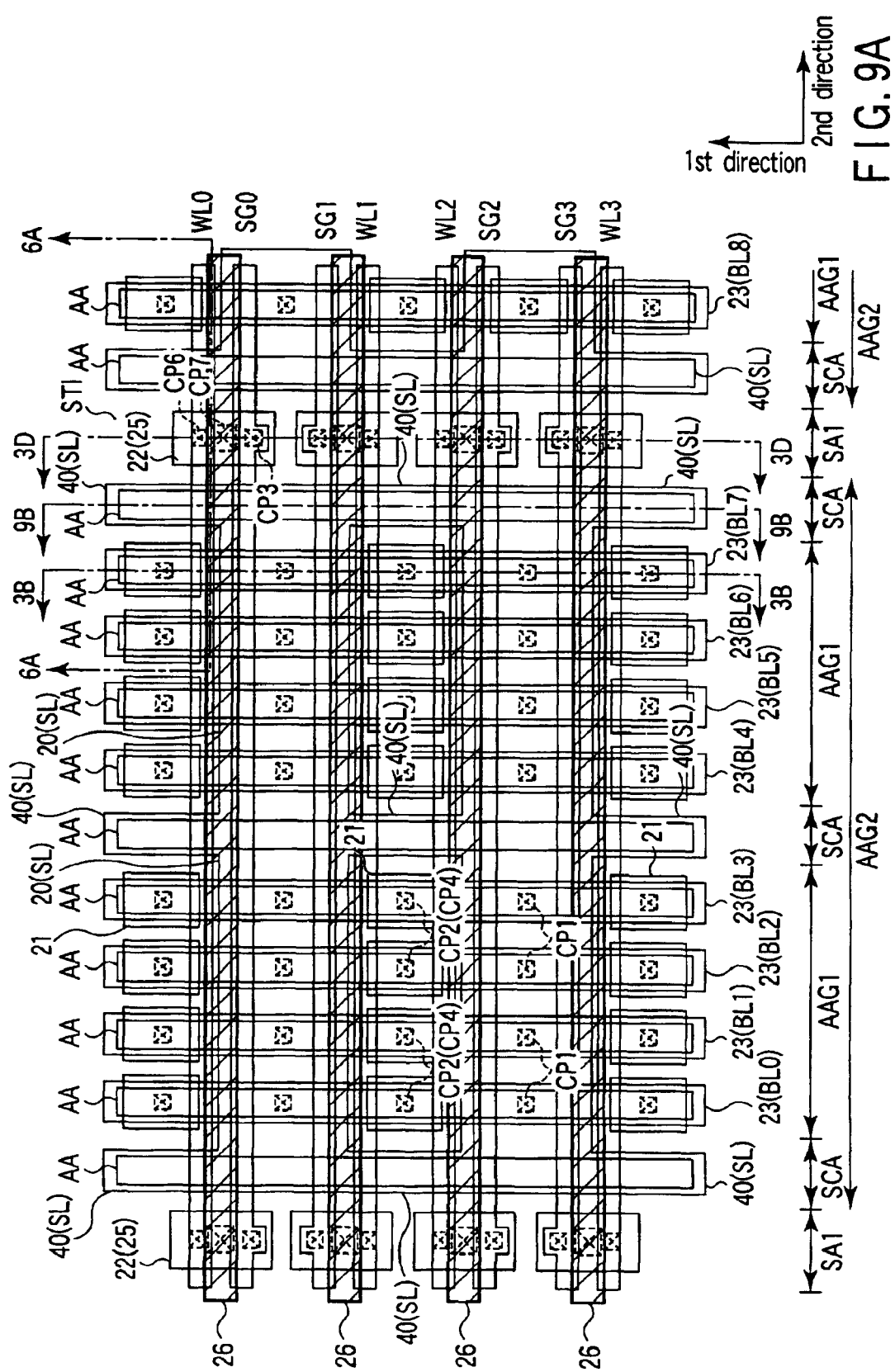
F I G. 9A

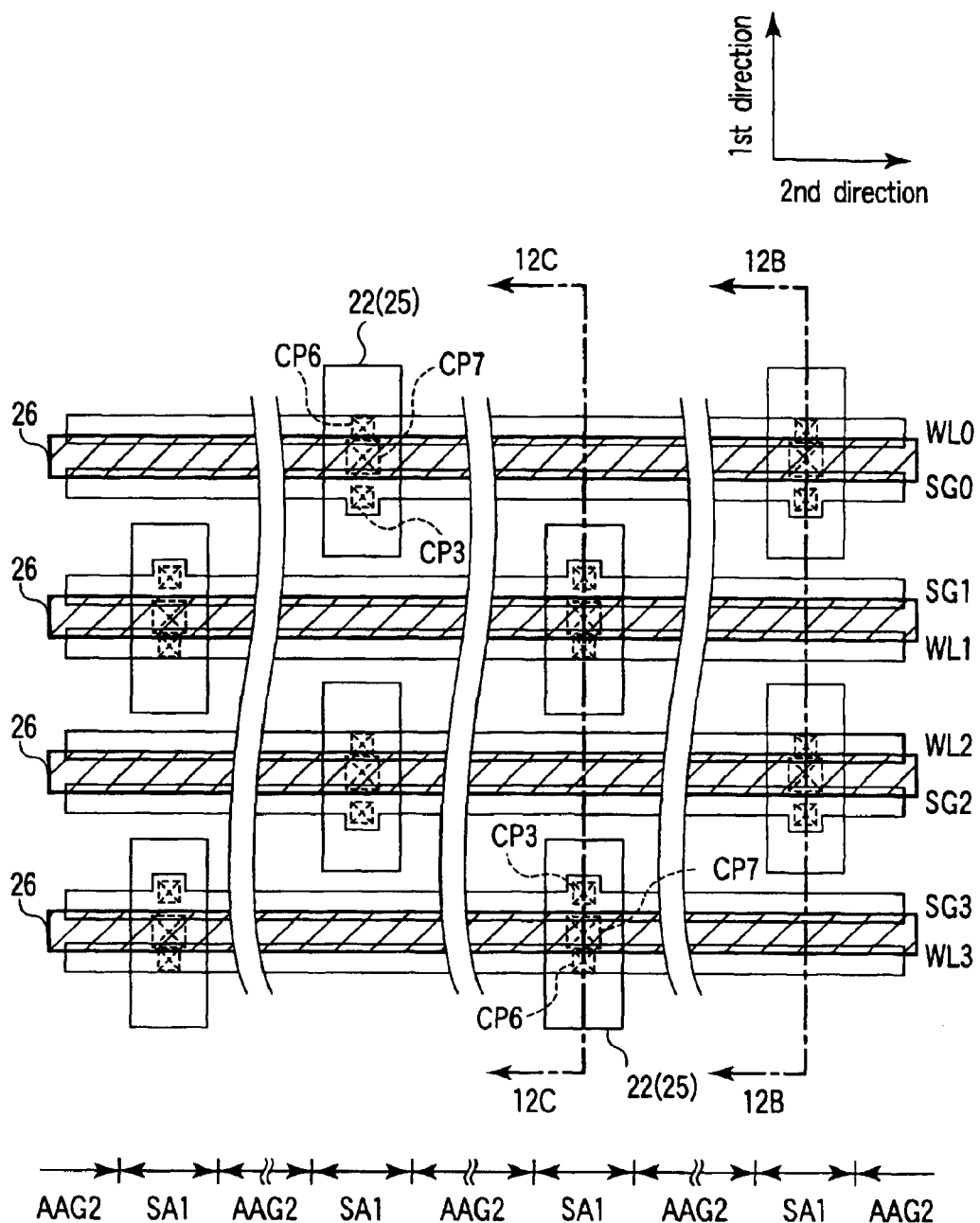
F I G. 12A

SEMICONDUCTOR MEMORY DEVICE INCLUDING MOS TRANSISTORS EACH HAVING A FLOATING GATE AND A CONTROL GATE

CROSS-REFERENCE TO RELATED APPLICATIONS

This application is based upon and claims the benefit of priority from the prior Japanese Patent Application No. 2003-122811, filed Apr. 25, 2003, the entire contents of which are incorporated herein by reference.

BACKGROUND OF THE INVENTION

1. Field of the Invention

This invention relates to a semiconductor memory device. More particularly, this invention relates to a nonvolatile semiconductor memory device including MOS transistors each having a floating gate and a control gate.

2. Description of the Related Art

Nonvolatile semiconductor memories, including NOR flash memories and NAND flash memories, are widely used.

In recent years, a flash memory combining the best features of a NOR flash memory and a NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. This flash memory has a memory cell including two MOS transistors. In such a memory cell, one MOS transistor functioning as a nonvolatile memory section has a structure including a control gate and a floating gate and is connected to a bit line. The other MOS transistor, which is connected to a source line, is used to select a memory cell. However, with the conventional flash memory, the reliability of the operation is sometimes insufficient because of the high wiring resistances or the like of the select gate lines and source lines.

BRIEF SUMMARY OF THE INVENTION

A semiconductor memory device according to an aspect of the present invention comprises:

a plurality of memory cells each of which includes a first MOS transistor with a charge accumulation layer and a control gate and a second MOS transistor having one end of its current path connected to one end of a current path of the first MOS transistor;

a memory cell array which has the memory cells arranged in a matrix in such a manner that the memory cells adjoining in the column direction share the other ends of the current paths of the first MOS transistors or the other ends of the current paths of the second MOS transistors;

bit lines each of which connects commonly the other ends of the current paths of the first MOS transistors of the memory cells in the same column;

word lines each of which is formed by connecting commonly the control gates of the first MOS transistors of the memory cells in the same row;

select gate lines each of which is formed by connecting commonly the gates of the second MOS transistors of the memory cells in the same row;

a column decoder which selects any one of the bit lines;

a first row decoder which selects any one of the word lines;

a second row decoder which selects any one of the select gate lines; and first metal wiring layers which are provided for every select gate lines, each of which is formed in the row direction so as to pass through almost the central part of the memory cells, is connected electrically to the corresponding one of the select gate lines, and transmits a row select signal for the second row decoder to select the select gate line.

BRIEF DESCRIPTION OF THE SEVERAL VIEWS OF THE DRAWING

FIG. 1 is a block diagram of a flash memory according to a first embodiment of the present invention;

FIG. 7A is a plan view of a memory cell array included in a flash memory according to a third embodiment of the present invention;

FIG. 9A is a plan view of a memory cell array included in a flash memory according to a fourth embodiment of the present invention;

FIG. 12A is a plan view of a flash memory according to a first modification of the first to sixth embodiments;

DETAILED DESCRIPTION OF THE INVENTION

Figure 2A:
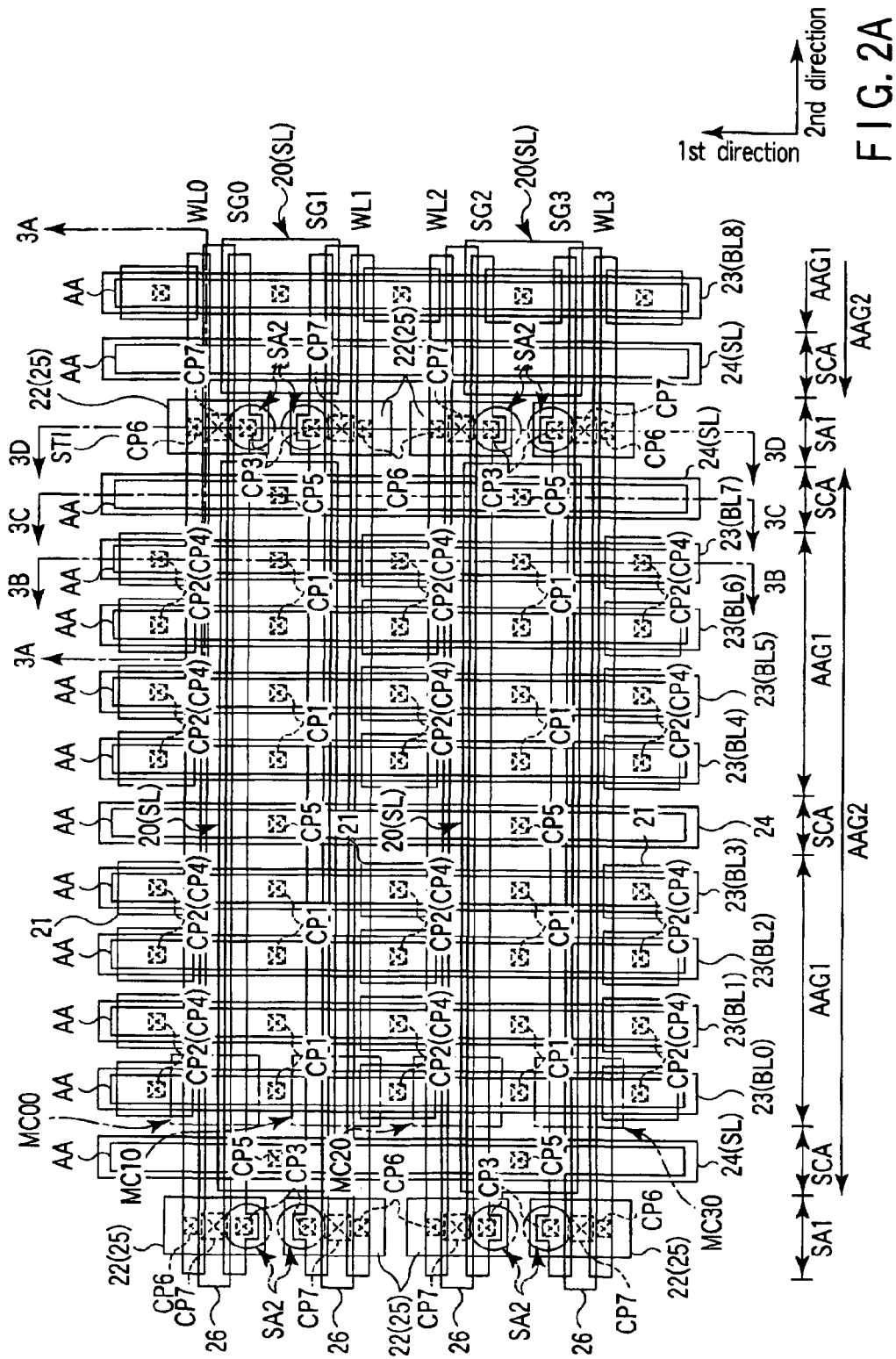
FIG. 2A is a plan view of a memory cell array included in the flash memory of the first embodiment.

A nonvolatile semiconductor memory device according to a first embodiment of the present invention will be explained by reference to FIG. 1. FIG. 1 is a block diagram of a flash memory according to the first embodiment.

As shown in FIG. 1, a flash memory 10 comprises a memory cell array 11, a column decoder 12, a sense amplifier 13, a first row decoder 14, a second row decoder 15, and a source line driver 16.

The memory cell array 11 has (m+1)×(n+1) memory cells MC00 to MCmn (where m and n are natural numbers) arranged in a matrix. Each of the memory cells MC has a memory cell transistor MT and a select transistor ST whose current paths are connected in series with each other. The memory cell transistor MT has a stacked gate structure in which a floating gate is formed on a semiconductor substrate with a gate insulating film intervening between the floating gate and the substrate and a control gate is formed on the floating gate with an inter-gate insulating film intervening between the control gate and the floating gate. The source region of the memory cell transistor MT is connected to the drain region of the select transistor ST. Memory cells MC adjoining in the column direction share the source region of the select transistor ST or the drain region of the memory cell transistor MT.

The control gates of the memory cell transistors MT of the memory cells in the same row are connected commonly to any one of word lines WL0 to WLm. The gates of the select transistors ST of the memory cells in the same row are connected commonly to any one of select gate lines SG0 to SGm. The drains of the memory cell transistors MT of the memory cells MC in the same column are connected commonly to any one of bit lines BL0 to BLn. The sources of the select transistors ST of the memory cells MC are connected commonly to a source line SL and are connected to a source line driver 16.

The column decoder 12 decodes a column address signal, thereby producing a column address decode signal. Then, on the basis of the column decode signal, the column decoder 12 selects any one of the bit lines BL0 to BLn.

The first and second row decoders 14, 15 decode a row address signal, thereby producing a row address decode signal. Then, the first row decoder 14 selects any one of the word lines WL0 to WLm in a write operation. The second row decoder 15 selects any one of the select gate lines SG0 to SGm in a read operation.

The sense amplifier 13 amplifies the data read from the selected memory cell MC selected by the second row decoder and column decoder 12.

The source line driver 16 supplies a voltage to the source line SL in a read operation.

Figure 2B:
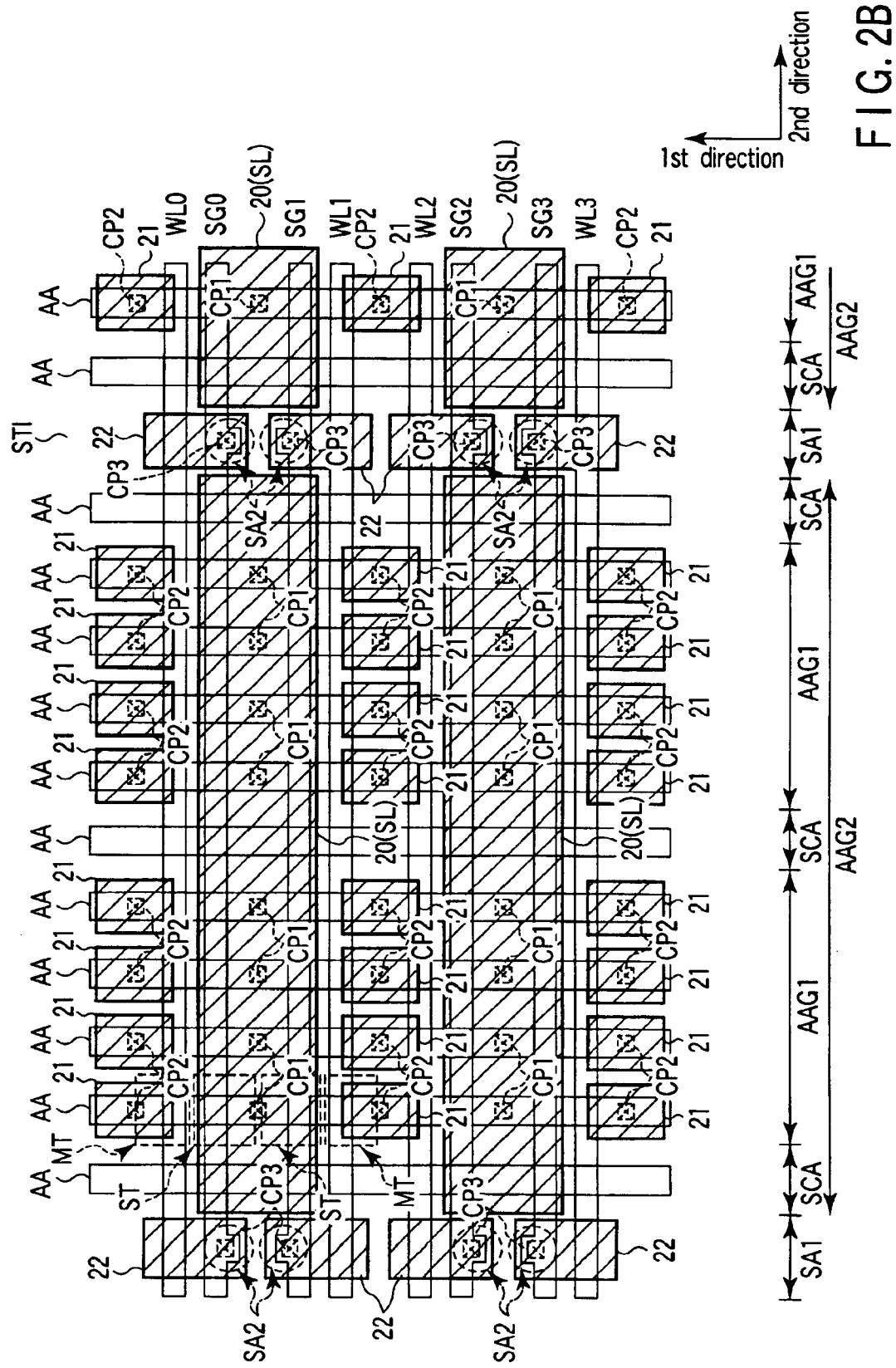
FIG. 2B is a plan view of a memory cell array included in the flash memory of the first embodiment, which shows a wiring pattern of a first-layer metal wiring layer.
Figure 2C:
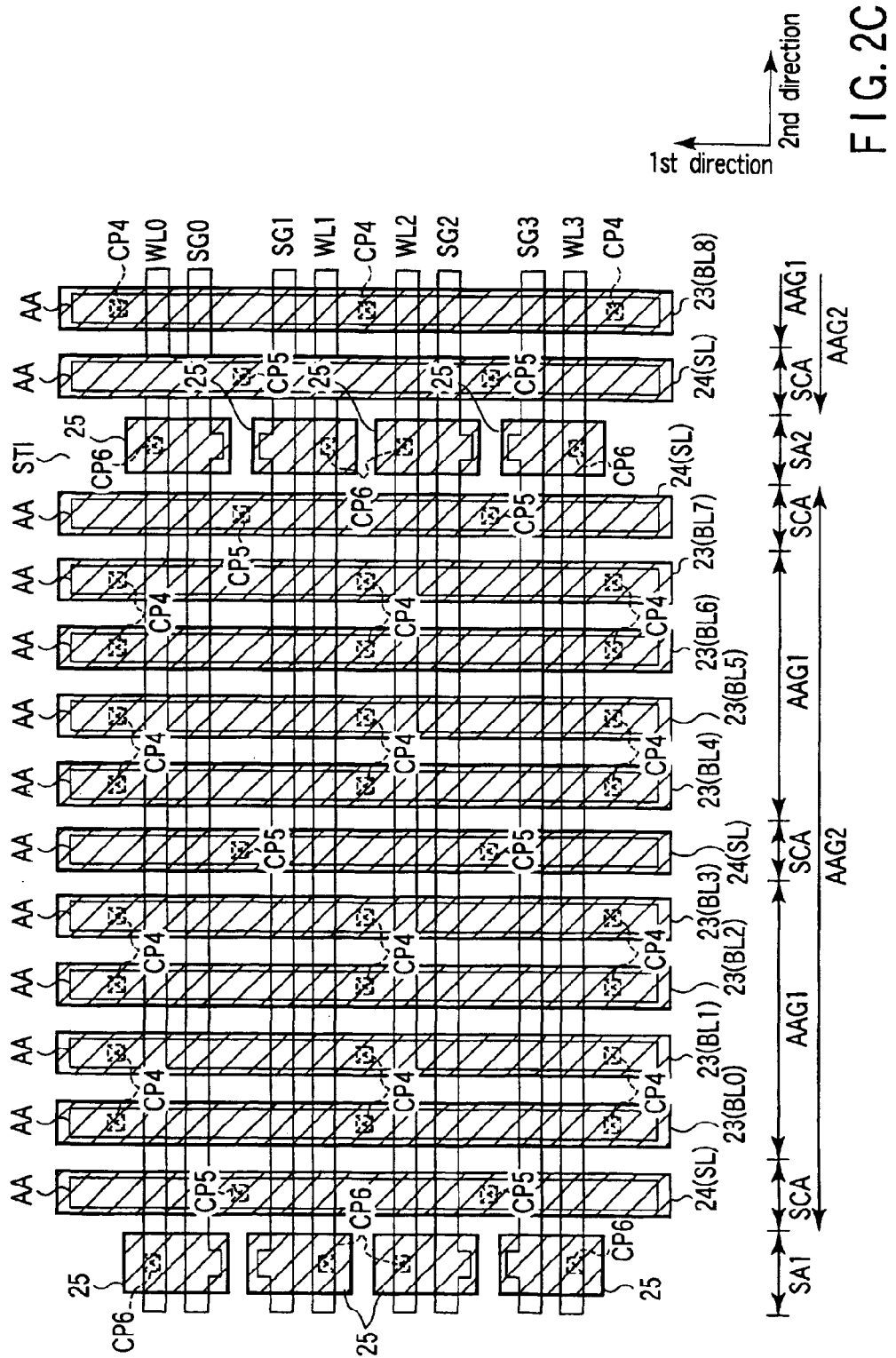
FIG. 2C is a plan view of a memory cell array included in the flash memory of the first embodiment, which shows a wiring pattern of a second-layer metal wiring layer.
Figure 2D:
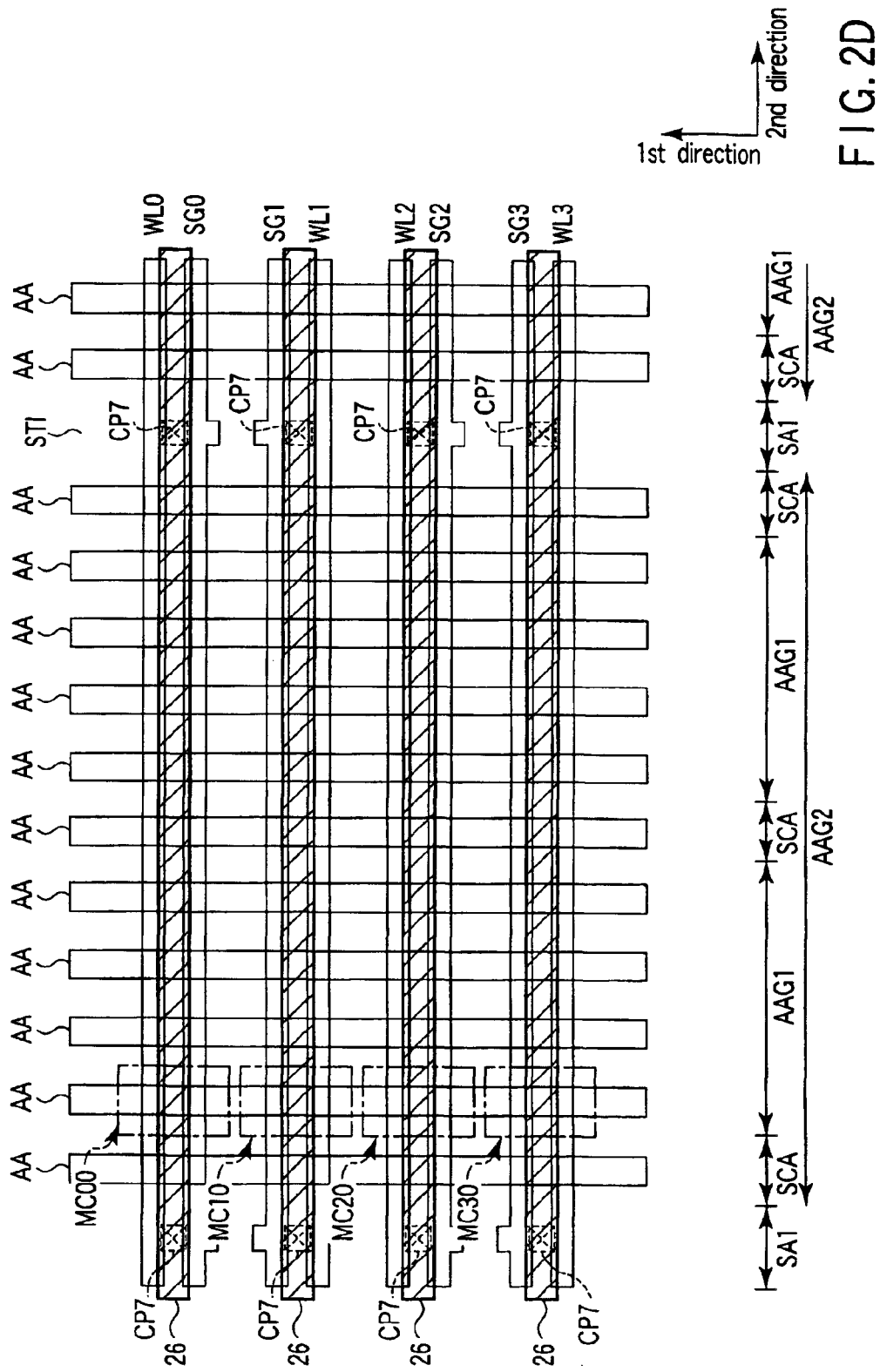
FIG. 2D is a plan view of a memory cell array included in the flash memory of the first embodiment, which shows a wiring pattern of a third-layer metal wiring layer.

Next, a plane pattern of the memory cell array 11 will be explained by reference to FIGS. 2A to 2D. FIG. 2A is a plan view of a part of the memory cell array 11. FIGS. 2B to 2D are plan views of plane patterns of first- to third-layer metal wiring layers together with element regions, word lines, and select gate lines. The regions shown in FIGS. 2B to 2D correspond to the regions in FIG. 2A.

As shown in FIGS. 2A to 2D, a plurality of stripe-shaped element regions AA extending in a first direction are formed in a semiconductor substrate 100 in a second direction perpendicular to the first direction. Then, stripe-shaped word lines WL0 to WLm and select gate lines SG0 to SGm extending in the second direction are formed in such a manner that they cross a plurality of the element regions AA. In the regions where the word lines WL0 to WLm and the element regions AA cross one another, memory cell transistors MT are formed. In the regions where the select gate lines SG0 to SGm and the element regions AA cross one another, select transistors ST are formed. In the regions where the word lines WL0 to WLm and the element regions AA cross one another, floating gates (not shown) isolated from one another on a memory cell transistor MT basis are formed.

As described above, adjacent memory cells MC have neighboring select gate lines SG or word lines WL. A group of four columns of element regions AA is referred to as a first element region group AAG1. Between adjacent first element region groups AAG1, a region where a column of element regions AA is formed is referred to as a source contact region SCA. The memory cells MC formed in a first element region group AAG1 are used to store data. However, the memory cells MC in the source contact region SCA, which are dummy memory cells, are not used to store data. A stitch region SA1 is formed in units of two columns of first element region groups AAG1. In the first embodiment, in the stitch region SA1, an element region AA is not formed. The width of the stitch region SA1 is equal to the sum of one element region AA and an element isolating region STI formed between element regions AA. On a stitch region SA1, the word lines WL0 to WLm and select gate lines SG0 to SGm are also formed. However, the word lines WL0 to WLm and select gate lines SG0 to SGm existing in the stitch region SA1 do not practically constitute the memory cells. Moreover, in the stitch region SA1, the select gates SG0 to SGm are so formed that part of them are wider than the rest. Specifically, part of the select gates are formed so as to project toward the adjacent select gate lines. Hereinafter, the regions are referred to as shunt regions SA2.

Next, a pattern of a first-layer metal wiring layer existing on the word lines WL0 to WLm and select gate lines SG0 to SGm will be explained by reference to FIGS. 2A and 2B. In FIG. 2B, the shaded area is the first-layer metal wiring layer.

As shown in the figures, between adjacent select gate lines SG (between SG0 and SG1, between SG2 and SG3, . . . ), a stripe-shaped metal wiring layer 20 extending in the second direction is formed. The metal wiring layer 20 is to be part of a source line. The metal wiring layer 20 is isolated by stitch regions SA1 in the longitudinal direction (or the second direction). That is, the metal wiring layer 20 is independent in each second element region group AAG2. The metal wiring layer 20 is connected to the source region of a select transistor ST via a contact plug CP1. In the first embodiment, in the source contact region SCA, a contact plug CP1 is not formed, with the result that the metal wiring layer 20 is not connected electrically to the source region of the memory cell in the source contact region SCA. On the drain region of the memory cell transistor MT in the first element region group AAG1, a metal wiring layer 21 of an island-like pattern is formed. The individual metal wiring layers 21, which are isolated from one another, are connected to the drain regions of the corresponding memory cell transistors MT via contact plugs CP2. Consequently, a plurality of groups of metal wiring layers 21 arranged in the second direction and stripe-shaped metal wiring layers 20 extending in the second direction are arranged alternately in the first direction. Furthermore, in the stitch region SA1, too, a metal wiring layer 22 of an island-like pattern is formed. The metal wiring layers 22 are formed in every pair of word lines and select gate lines (or a set of WL0 and SG1, a set of WL1 and SG1, . . . ). Then, they are connected to the shunt regions SA2 of the corresponding select gate lines SG via contact plugs CP3. The length of the metal wiring layer 22 in the second direction is almost the same as that of the metal wiring layer 21. Then, the metal wiring layer 22 is extended in the first direction from the top of the corresponding select gate line SG toward the top of the corresponding word line WL. The adjacent metal wiring layers 22 are isolated form each other.

Next, a pattern of second-layer metal wiring layers existing on the first-layer metal wiring layers 20 to 22 will be explained by reference to FIGS. 2A and 2C. In FIG. 2C, the shaded area indicates second-layer metal wiring layers.

As shown in the figures, in a first element region group AAG1, a stripe-shaped metal wiring layer 23 extending in the first direction is formed on an element region AA. The metal wiring layers 23, which function as bit lines BL0 to BLn, are connected to the corresponding first-layer metal wiring layers 21 via contact plugs CP4. In a source contact region SCA, too, a metal wiring layer 24 of a similar pattern to that of the metal wiring layer 23 is formed. Thus, the line width of the metal wiring layer 24 is the same as that of the metal wiring layer 23. The metal wiring layers 24, which function as part of a source line SL, are connected to the corresponding first-layer metal wiring layers 20 via contact plugs CP5. That is, a plurality of metal wiring layers 20 isolated from one another in the first direction are connected commonly by the metal wiring layers 24. In a stitch region SA1, an island-like metal wiring layer 25 is formed. The metal wiring layers 25 are provided for every pair of word lines and select gate lines, that is, for every first-layer metal wiring layers 22. The metal wiring layer 25, which has almost the same pattern as that of the metal wiring layer 22, overlaps with the metal wiring layer 22. Furthermore, the metal wiring layers 25 are connected to the corresponding metal wiring layers 22 via contact plugs CP6. Although in FIGS. 2A and 2C, the contact plug 25 is located just above the word line WL, it may be placed in another place, provided that it can connect the metal wiring layers 22 and 25.

Next, a pattern of third metal wiring layers existing on the second-layer metal wiring layers 23 to 25 will be explained by reference to FIGS. 2A and 2D. In FIG. 2D, the shaded area indicates third metal wiring layers.

As shown in the figures, stripe-shaped metal wiring layers 26 extending in the second direction are formed. The metal wiring layers 26 are provided for every pair sets of word lines and select gate lines (i.e., a set of WL0 and SG1, a set of WL1 and SG1, . . . ). The metal wiring layers 26 are connected via contact plugs CP7 to the second layer metal wiring layers 25 electrically connected to the corresponding select gate lines. That is, the individual metal wiring layers 25 function as shunt wires for the select gate lines SG0 to SGm. The metal wiring layer 25 is formed in a region between the central part of the word line WL and the central part of the select gate line SG corresponding to the word line WL. In other words, the metal wiring layer 25 passes through the central part of the memory cells MC. Thus, a plurality of metal wiring layers 26 are arranged at equal intervals in the first direction. Then, the metal wiring layers 26 are connected commonly among adjacent second element region groups AAG2 in the second direction.

Figure 3A:
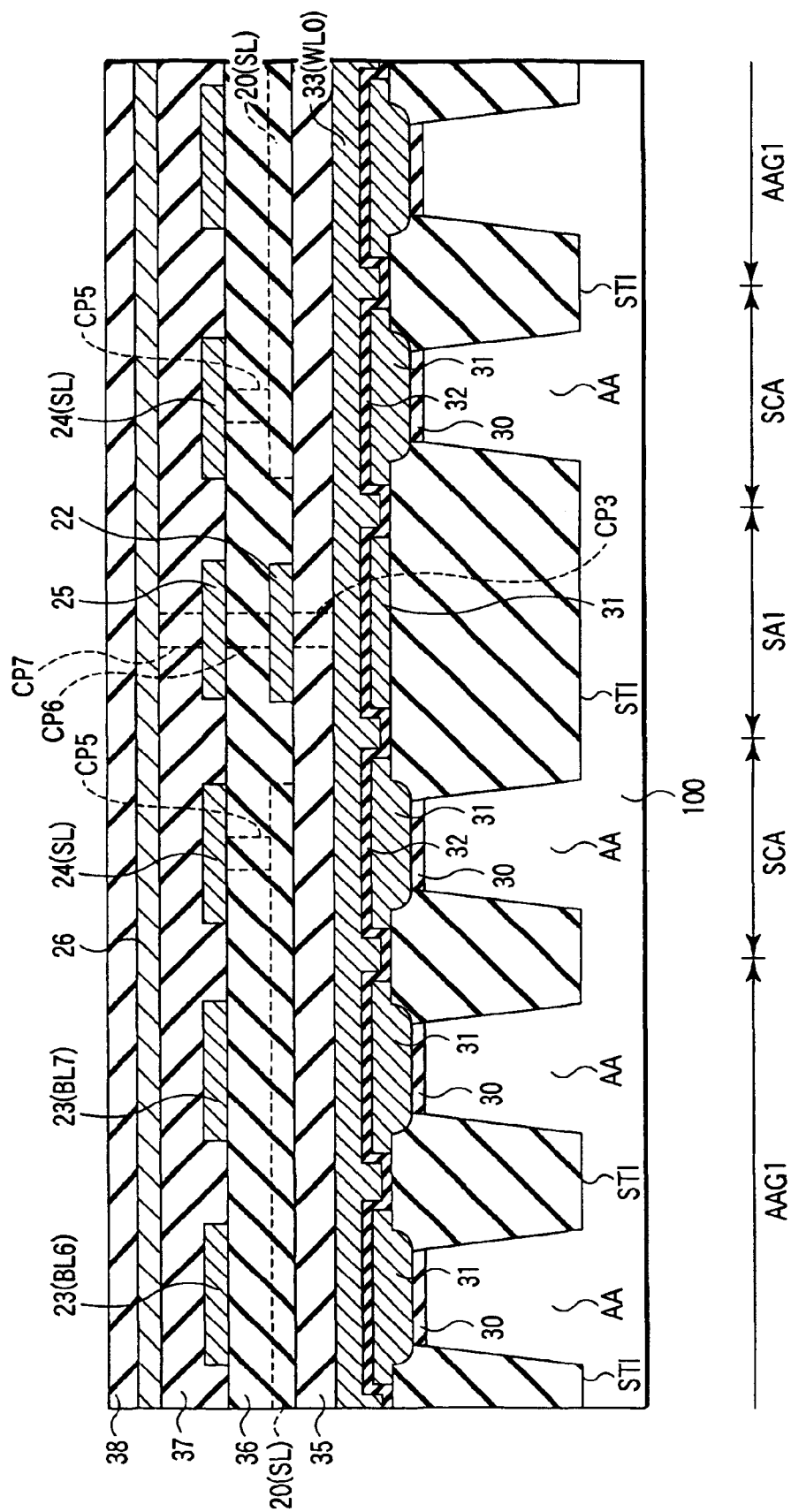
FIG. 3A is a sectional view taken along line 3A—3A of FIG. 2A.
Figure 3B:
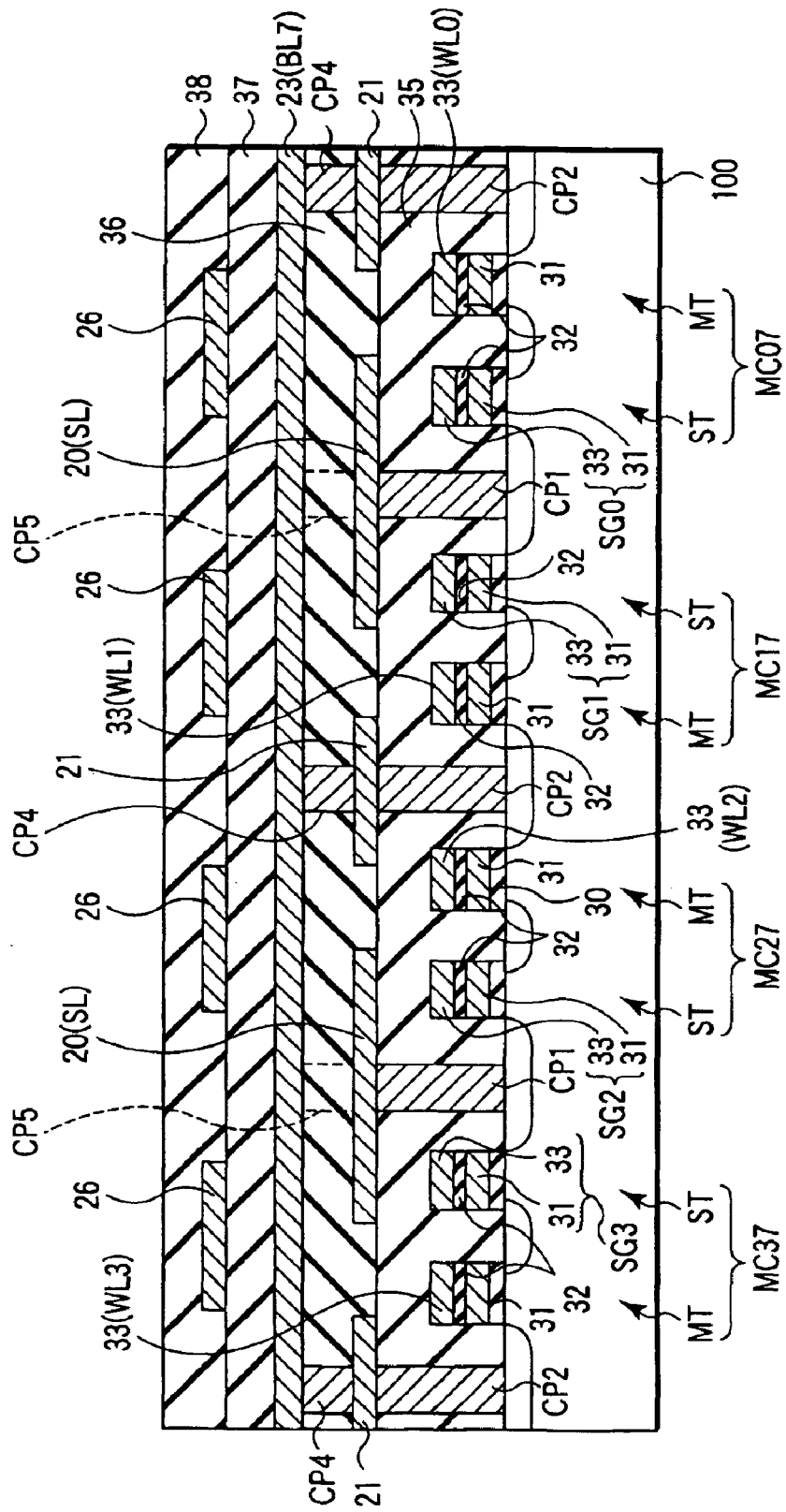
FIG. 3B is a sectional view taken along line 3B—3B of FIG. 2A.
Figure 3C:
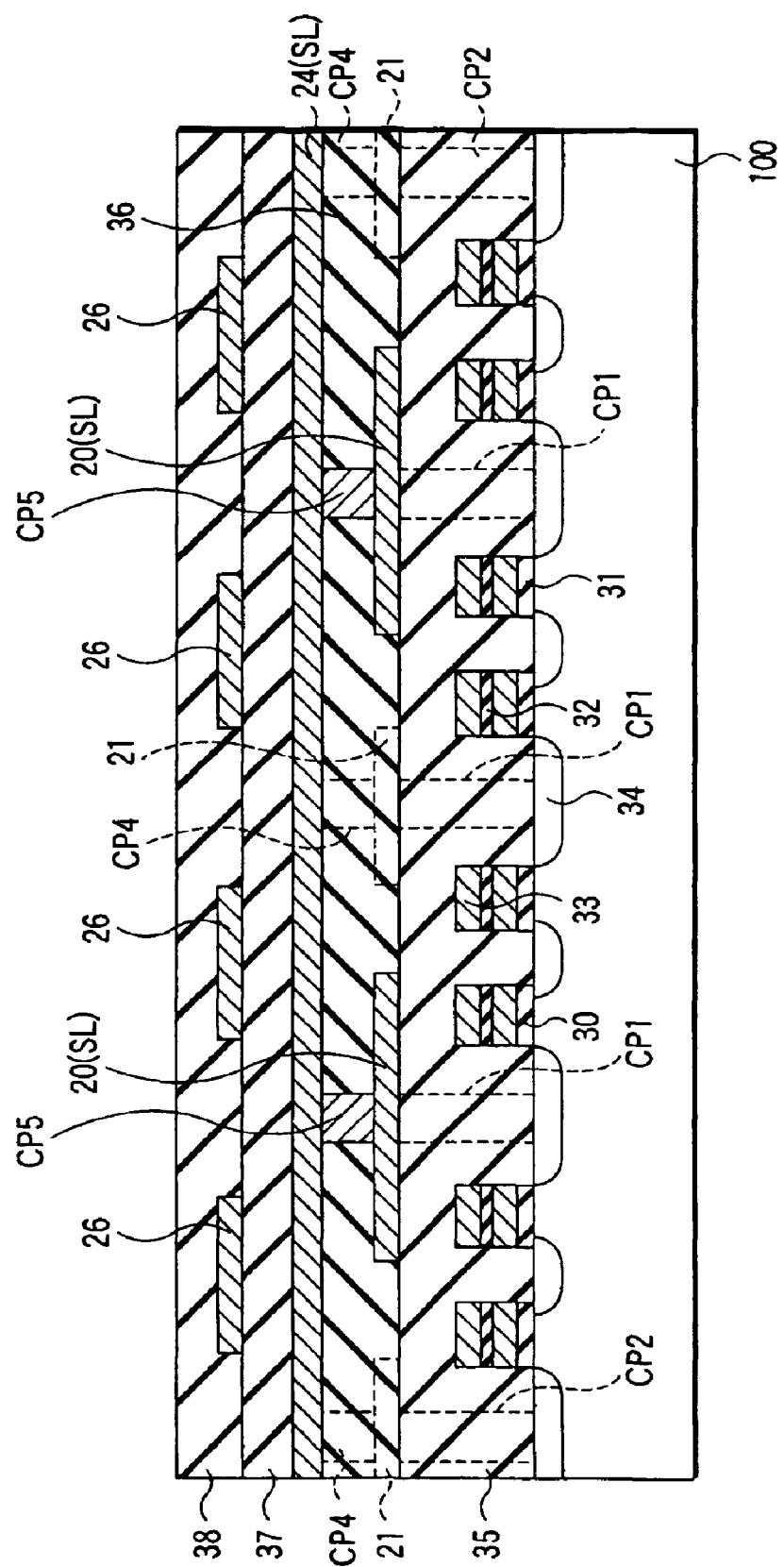
FIG. 3C is a sectional view taken along line 3C—3C of FIG. 2A.

Next, a cross-sectional structure of the flash memory configured as described above will be explained. A cross-sectional structure of the second element region group AAG2 will be explained by reference to FIGS. 3A to 3C. FIG. 3A is a sectional view taken along line 3A—3A of FIG. 2A. FIG. 3B is a sectional view taken along line 3B—3B of FIG. 2A. FIG. 3C is a sectional view taken along line 3C—3C of FIG. 2A.

As shown in the figures, in the semiconductor substrate 100, element isolating regions STI are formed. A region enclosed by element isolating regions STI is an element region AA. On an element region AA in the semiconductor substrate 100, a gate insulating film 30 is formed. On the gate insulating film 30, the gates of a memory cell transistor MT and a select transistor ST are formed. The gate electrodes of the memory cell transistor MT and select transistor ST have a polycrystalline silicon layer 31 formed on the gate insulating film 30, an inter-gate insulating film 32 formed on the polycrystalline silicon layer 31, and a polycrystalline silicon layer 33 formed on the inter-gate insulating film 32. The inter-gate insulating film 32 is made of, for example, a silicon oxide film, an ON film with a stacked structure of a silicon oxide film and a silicon nitride film, an NO film, or an ONO film. As shown in FIG. 3B, the polycrystalline silicon layer 31, which is isolated from another one between adjacent element regions AA, functions as a floating gate in the memory cell transistor MT. The polycrystalline silicon layer 33, which also functions as a control gate (or word line WL), is connected commonly among adjacent element regions AA. In the select transistor ST, a part of the inter-gate insulating film 32 is removed in the shunt region and the polycrystalline silicon layers 31, 33 are electrically connected. Then, the polycrystalline silicon layers 31, 33 function as select gate lines SG. In the select transistor ST, too, the polycrystalline silicon layer 33 and polycrystalline silicon layer 31 are connected commonly among adjacent element regions AA. That is, unlike the memory cell transistors MT whose floating gates are isolated cell by cell, the floating gates are all connected to one another. Then, at the surface of the semiconductor substrate 100 located between adjacent gate electrodes, an impurity diffused layer 34 is formed. The impurity diffused layer 34 is shared by adjacent transistors.

As described above, memory cells MCs including memory cell transistors MTs and select transistors STs are formed so as to have the following relationship. Adjacent memory cells MC, MC have their select transistors ST adjacent to each other and their memory cell transistors MT adjacent to each other. They share an impurity diffused layer 34 between them. Thus, when the select transistors ST are adjacent to each other, the two adjacent memory cells MC, MC are arranged symmetrically, centering on the impurity diffused layer 34 shared by the two select transistors ST, ST. Conversely, when the memory cell transistors MT are adjacent to each other, the two adjacent memory cells MC, MC are arrange symmetrically, centering on the impurity diffused layer 34 shared by the two memory cell transistors MT, MT.

Then, on the semiconductor substrate 100, an interlayer insulating film 35 is formed so as to cover the memory cell transistors MT and select transistors ST. In the interlayer insulating film 35, a contact plug CP1 reaching the impurity diffused layer (source region) 34 shared by two select transistors ST, ST is formed. Then, on the interlayer insulating film 35, a metal wiring layer 20 connected to the contact plug CP1 is formed. The metal wiring layer 20 functions as a source line SL. In the interlayer insulating film 35, a contact plug CP2 reaching an impurity diffused layer (drain region) 34 shared by two memory cell transistors MT, MT is formed. On the interlayer insulating film 35, a metal wiring layer 21 connected to the CP2 is formed.

On the interlayer insulating film 35, an interlayer insulating film 36 is formed so as to cover the metal wiring layers 20, 21. In the interlayer insulating film 36, contact plugs CP4 reaching the metal wiring layer 21 are formed (see FIG. 3B). Then, on the interlayer insulating film 36, a metal wiring layer 23 connected commonly to a plurality of contact plugs CP4 is formed (see FIG. 3B). The metal wiring layer 23 functions as a bit line BL. Further in the interlayer insulating film 36, contact plugs CP5 reaching the metal wiring layer 20 are formed (see FIG. 3C, source contact region SCA). Then, on the interlayer insulating film 36, a metal wiring layer 24 connecting a plurality of contact plugs CP5 commonly in the direction of bit line is formed (see FIG. 3C, source contact region SCA). The metal wiring layer 24 functions as a part of a source line SL.

On the interlayer insulating film 36, an interlayer insulating film 37 is formed so as to cover the metal wiring layers 23, 24. Then, on the interlayer insulating film 37, metal wiring layers 26 are formed. On the interlayer insulating film 37, an interlayer insulating film 38 is formed so as to cover the metal wiring layer 26.

Figure 3D:
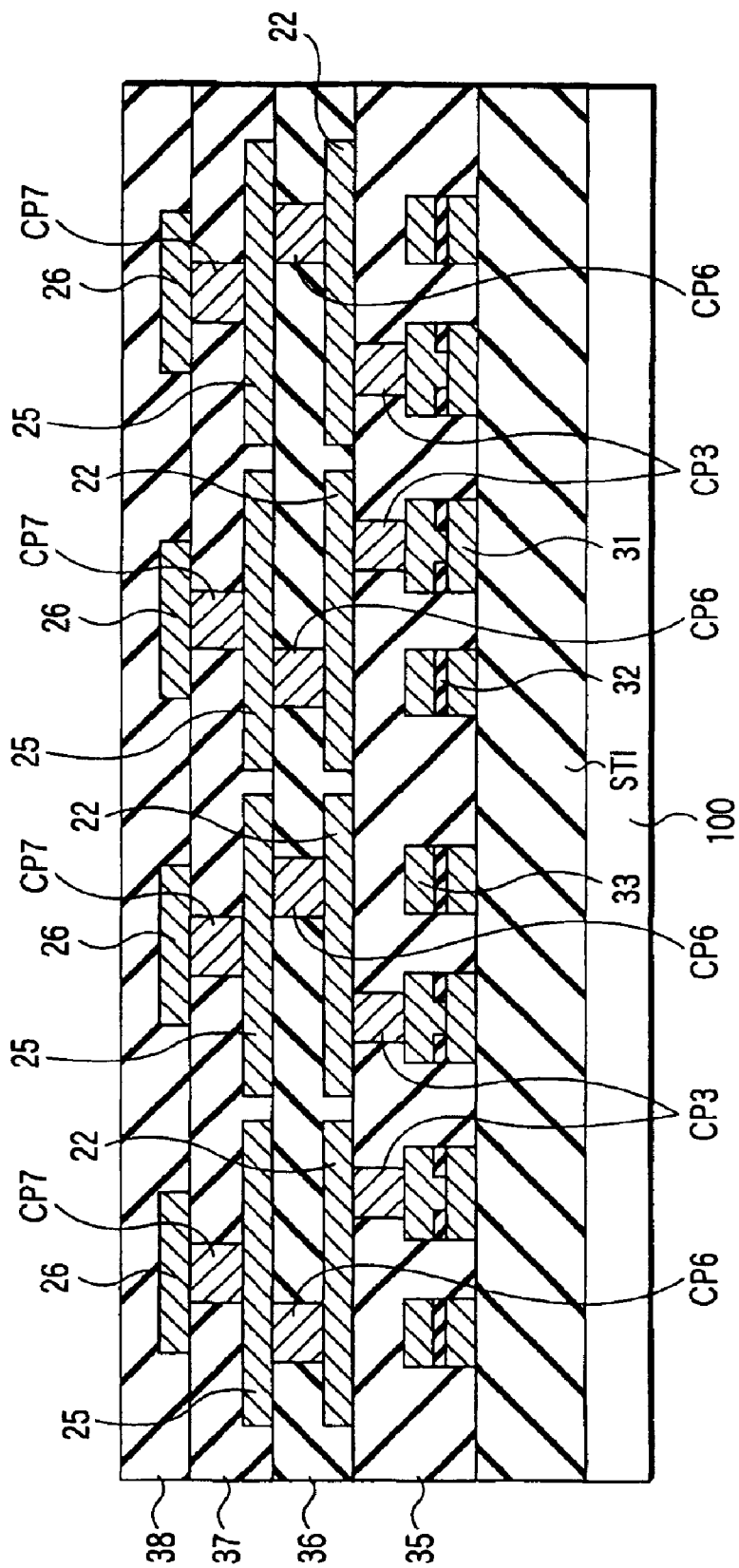
FIG. 3D is a sectional view taken along line 3D—3D of FIG. 2A.

Next, a cross-sectional structure of the stitch region SA will be explained by reference to FIGS. 3A and 3D. FIG. 3D is a sectional view taken along line 3D—3D of FIG. 2A.

As shown in the figures, element isolating regions STI are formed in the semiconductor substrate 100. On an element isolating region STI, a floating gate, a control gate, and the gate electrode of a select transistor are formed. In the interlayer insulating film 35 formed on the semiconductor substrate 100, contact holes CP3 reaching the polycrystalline silicon layer 33 of the select transistor are formed. On the interlayer insulating film 35, metal wiring layers 22 are formed. The metal wiring layer 22 is extended so as to cover the top of the gate electrode of the corresponding select transistor and the top of the stacked gate electrode of the memory cell transistor corresponding to the select transistor (see FIG. 3D). On the interlayer insulating film 35, an interlayer insulating film 36 is formed so as to cover the metal wiring layers 22. In the interlayer insulating film 36, contact plugs CP6 reaching the metal wiring layer 22 are formed. On the interlayer insulating film 36, metal wiring layers 25 to be connected to the contact plugs CP6 are formed. Like the metal wiring layer 22, the metal wiring layer 25 is extended so as to cover the top of the gate electrode of the corresponding select transistor and the top of the stacked gate electrode of the memory cell transistor corresponding to the select transistor (see FIG. 3D). On the interlayer insulating film 36, an interlayer insulating film 37 is formed. In the interlayer insulating film 37, contact plugs CP7 reaching the metal wiring layer 25 are formed. As shown in FIG. 3D, the contact plug CP7 is in the central part of the memory cell. In other words, the contact plug CP7 is formed in a region between the central part of the stacked gate of the memory cell transistor MT and the central part of the gate electrode of the select transistor ST. On the interlayer insulating film 37, metal wiring layers 26 are formed. As shown in FIG. 3D, the metal wiring layers 26 are arranged at equal intervals on the interlayer insulating film 37. Then, on the interlayer insulating film 37, an interlayer insulating film 38 is formed so as to cover the metal wiring layers 26.

Next, the operation of the flash memory configured as described above will be explained.

<Write Operation>

The data is written simultaneously into all of the memory cells connected to any one of the word lines. Then, "0" data or "1" data is written, depending on whether electrons are injected into the floating gate of a memory cell transistor MT. Electrons are injected into the floating gate by Fowler-Nordheim (FN) tunneling.

Figure 4A:
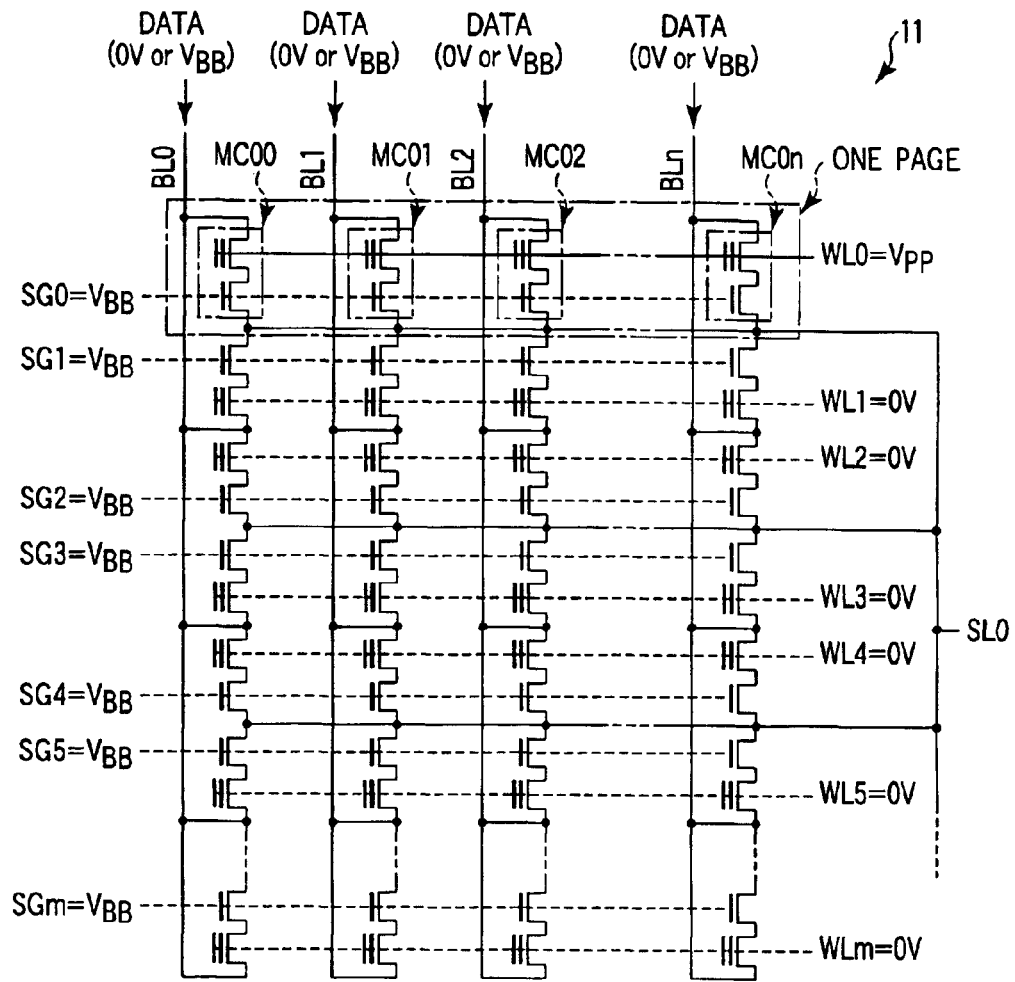
FIG. 4A is a circuit diagram of a memory cell array included in the flash memory of the first embodiment, which helps to explain a write operation.

Hereinafter, a write operation will be explained in detail by reference to FIGS. 1 and 4A. FIG. 4A is a circuit diagram of the memory cell array 11 to help explaining a write operation.

In FIG. 1, when write data ("1" or "0") is input from the I/O terminal (not shown), the write data is inputted to a latch circuit (not shown) provided for each bit line. If "1" data is stored in the latch circuit, 0 V is applied to the bit line. Conversely, if "0" data is stored, VBB (−6 V) is applied to the bit line.

Then, the first row decoder 14 selects any one of the word lines WL0 to WL4$m$. Then, it applies Vpp (e.g., 10 V) to the selected word line. The second row decoder 15 places the select gate lines SG0 to SGm at VBB (−6 V). And the substrate of the memory cell is also set to VBB (−6 V). Thus, all of the select transistors ST are turned off. As a result, the select transistors are electrically disconnected from the source line SL.

As a result, a potential corresponding to "1" data or "0" data is applied to the drain regions of the memory cell transistors MT via the bit lines BL0 to BLn. Then, Vpp (10 V) is applied to the selected word line WL, 0 V is applied to a channel regions of the memory cell transistors MT into which "1" data is to be written, and VBB (−6 V) is applied to the channel regions of the memory cell transistors MT into which "0" data is to be written. Thus, in the memory cell transistor MT into which "1" data is to be written, electrons are not injected into the floating gate since the potential difference (10 V) between the gate and channel of the memory cell transistor MT is not sufficient to cause FN tunneling, with the result that the memory cell transistor MT keeps a negative threshold value. On the other hand, in the memory cell transistor MT into which "0" data is to be written, electrons are injected into the floating gate by FN tunneling since the potential difference (16 V) between the gate and channel of the memory cell transistor MT is large.

As a result, the threshold voltage of the memory cell transistor MT turns into positive.

For example, FIG. 4A shows a case where the data is written into the memory cells connected to word line WL0. First, the first row decoder 14 selects word line WL0 and Vpp is applied to word line WL0. The other word lines WL1 to WLm are at 0 V. All of the select gate lines SG0 to SGm are at VBB (−6 V). In that state, 0 V or VBB is applied to each of the bit lines BL0 to BLn. Then, in the memory cells connected to word line WL0 and to the bit line to which VBB is applied, electrons are injected into the floating gate. On the other hand, in the memory cells connected to the word lines WL1 to WLm, the word lines WL1 to WLm are at a potential of 0 V, with the result that no electron is injected into the floating gates, regardless of the potentials of the bit lines BL0 to BLn. In this way, the data is written into one page of memory cells MC simultaneously.

<Read Operation>

In a data read operation, the data can be read simultaneously from a plurality of memory cells connected to any one of the word lines.

Figure 4B:
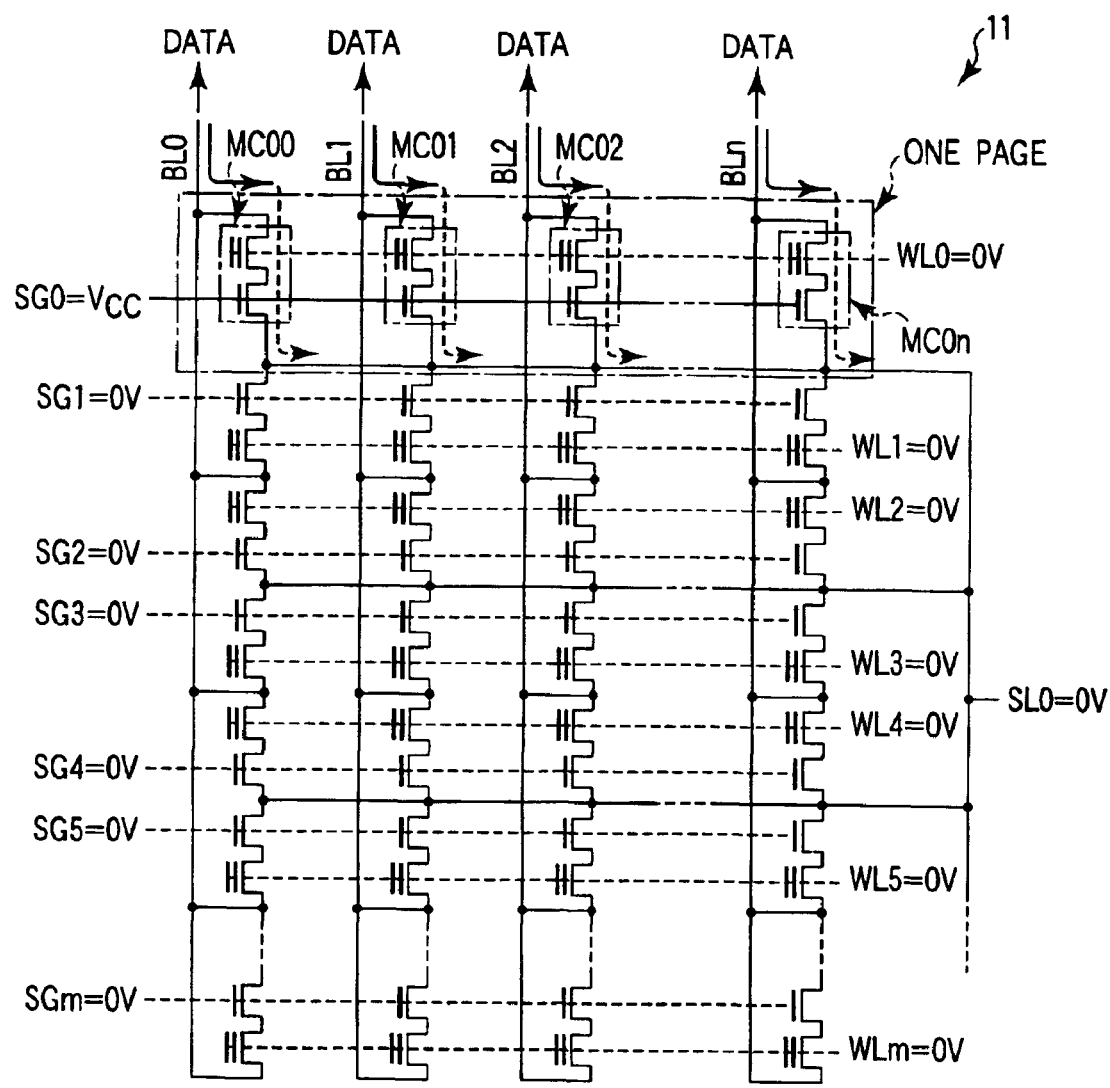
FIG. 4B is a circuit diagram of a memory cell array included in the flash memory of the first embodiment, which helps to explain a read operation.

Hereinafter, a read operation will be explained in detail by reference to FIGS. 1 and 4B. FIG. 4B is a circuit diagram of the memory cell array 11 to help explaining the read operation.

In FIG. 1, the second row decoder 15 selects any one of the select gate lines SG0 to SGm. A high level (e.g., Vcc) is applied to the selected select gate line. A low level (e.g., 0 V) is applied to all of the unselected select gate lines. Thus, the select transistor ST connected to the selected select gate line is turned on, whereas the select transistors ST connected to the unselected select gate lines are turned off. Thus, the select transistor ST in the selected memory cell is connected electrically to the source line SL. In addition, the first row decoder 14 places all the word lines WL0 to WLm at the low level (0 V). The source line driver 16 sets the potential of the source line at 0 V.

Then, for example, a voltage of about 1 V is applied to each of the bit lines BL0 to BLn. Then, since the memory cell transistor MT of a memory cell MC into which "1" data has been written has a negative threshold voltage, it turns on. Thus, in a memory cell MC connected to the selected select gate line, current flows from the bit line to the source line SL via the current paths of the memory cell transistor MT and select transistor ST. On the other hand, since the memory cell transistor MT of a memory cell MC into which "0" data has been written has a positive threshold voltage, it turns off. Thus, no current flows from the bit line to the source line.

As a result, the potentials of the bit lines BL0 to Bln vary. The sense amplifier 70 amplifies the variations, thereby carrying out the read operation.

For example, FIG. 4B shows a case where the data is read from the memory cells connected to word line WL0. First, the second row decoder 15 selects select gate line SG0 and Vcc is applied to the select gate line SG0. The other select gate lines SG1 to SGm are at 0 V. All of the word lines WL0 to WLm are also at 0 V. In that state, a voltage of about 1 V is applied to each of the bit lines BL0 to BLn. Then, current flows through the bit line connected to the memory cell which is connected to select gate line SG0 and into which "1" data has been written, with the result that the potential of the bit line drops. On the other hand, no current flows through the bit lines connected to the memory cells MC into which "0" data has been written, with the result that the potential of the bit lines remain unchanged. In this way, the data is read simultaneously from one page of memory cells MC.

<Erase Operation>

The data is erased simultaneously from all the memory cells sharing a well region. Thus, in the example of FIG. 1, all the memory cells included in the memory cell array 11 are erased at the same time.

In FIG. 1, the first row decoder 14 places the potentials of all the word lines WL0 to WLm at VBB (−6 V). The potential of the semiconductor substrate (well region) is set at Vpp (10 V). As a result, electrons are extracted from the floating gates of the memory cell transistors in the memory cells MC into the semiconductor substrate by FN tunneling. As a result, the threshold voltages of all the memory cells MC become negative, thereby erasing the data.

As described above, the flash memory of the first embodiment produces the following effects:

(1) The Reliability of a Read Operation can be Improved. ①

With the configuration of the first embodiment, metal wiring layers 26 are formed as shunt wires for select gate lines SG. Normally, the gate electrodes of select transistors ST are made of polycrystalline silicon. Since polycrystalline silicon has a relatively high resistance, it takes time for the row select signal to propagate. Thus, with a conventional configuration, the operation of a select transistor was slow, which made the read operation of the flash memory slow.

With the first embodiment, however, a row select signal is transmitted by means of a low-resistance metal wiring layer 26. Thus, the row select signal output from the second row decoder 15 reaches the gate electrode of the select transistor ST quickly. As a result, the operating speed of the select transistor is increased, which improves the reliability of the read operation of the flash memory.

(2) The Reliability of a Read Operation can be Improved. ②

With the configuration of the first embodiment, as shown in FIG. 2D and FIGS. 3B to 3C, the metal wiring layers 26 functioning as shunt wires for select gate lines are arranged at equal intervals. Thus, the coupling capacitance between adjacent metal wiring layers 26 is decreased. As a result, the operating speed of the select transistor ST is increased, which improves the reliability of the read operation of the flash memory.

(3) The Reliability of a Read Operation can be Improved. ③

With the configuration of the first embodiment, as shown in FIGS. 2B and 2C, a plurality of metal wiring layers 20 (part of the source lines) isolated in the direction of bit line are connected commonly to one another by the metal wiring layers 24 (part of the source line) higher in level than the metal wiring layers 20. Thus, all of the metal wiring layers 20 are connected electrically in the direction of bit line, which reduces the resistance of the source line SL.

In a read operation, 0 V is applied to the source line SL. If the resistance of the source line were high as found in the prior art, the potential of the source line would rise. As a result, it would be difficult to cause a large read current to flow in the memory cell.

With the first embodiment, however, since the resistance of the source line is low, a rise in the potential of the source line can be suppressed. Thus, it is possible to cause a large read current to flow, which improves the reliability of the read operation of the flash memory.

(4) The Fabrication Processes Become Easier. ①

In the first embodiment, there is provided a stitch region SA1 connecting the shunt wire 26 for select gate lines and a select gate line. In the stitch region SA1, the shut wire 26 and the select gate line SG are connected via the metal wiring layers 22, 25, and contact plugs CP3, CP6, CP7.

In the first embodiment, like the stacked gate of a memory transistor, the select gate line includes a polycrystalline silicon film 31 of the underlying layer, the inter-gate insulating film 32, and the polycrystalline film 33 of the overlying layer. The inter-gate film 32 has been removed in part of the region. Thus, there is no need to remove the polycrystalline silicon film 33 in making contact with the select gate line. In such a case, the region where the shunt wire 26 for select gate lines contact the select gate line SG can be made very small. That is, the metal wring layers 22, 25 become isolated patterns with very small areas. More specifically, the metal wiring layers 22, 25 need only an area equal to the sum of the contact area for the select gate line and a margin for lithography taking connection with wires into account.

However, the metal wiring layers formed in insolated patterns with small areas are liable to be often missed in metal wiring processes, making the processes unstable, which contributes to a decrease in the yield.

With the configuration of the first embodiment, however, as shown in FIGS. 2B and 2C, the metal wiring layers 22, 25 are extended from the top of the select gate line toward the control gate of the memory cell transistor. Specifically, the metal wiring layers 22, 25, isolated patterns, are extended in the direction of the bit line, thereby increasing their area. This prevents the metal wiring layers 22, 25 from being missed during the metal wiring process, which improves the reliability of the fabrication processes.

Furthermore, with the configuration of the first embodiment, to increase the areas of the metal wiring layers 22, 25, the metal wiring layers 22, 25 are extended in the direction of the bit line, not in the direction of the word line. Thus, it is possible to prevent the area of the memory cell array 11 from increasing.

In addition, this effect is noticeable when adjacent memory cells MC share a bit line contact as in the first embodiment. The reason is that the metal wiring layers 22, 25 are extended in the direction of the bit line and in the direction of adjacent control gates. Therefore, this prevents adjacent metal wiring layers 22 or adjacent metal wiring layers 25 from short-circuiting. As a result, the fabrication processes can be made easier.

(5) The Fabrication Processes Become Easier. ②

With the first embodiment, dummy memory cells are formed also in the source contact region SCA. The dummy memory cells have the same pattern as that of the memory cells MC in the first element region group AA1. That is, in the source contact region SCA and first element region group AA1, specific regularity is maintained in pattern. In the stitch region SA1, too, select gate lines and word lines are formed. That is, in the stitch region SA1, too, a polycrystalline silicon film 31, an inter-gate insulating film 32, and a polycrystalline silicon film 33 whose pattern is the same as that of the memory cells MC are formed. Therefore, in the memory cell array, a uniform regularity is maintained in the pattern. The regularity is not ruined in the source contact region SCA and stitch region SA1. As a result, the fabrication of each layer in the memory cell array can be made easier without an unnecessary increase in the area, which facilitates the fabrication processes.

(6) The Fabrication Processes Become Easier. ③

With the first embodiment, the metal wiring layers 24 connecting a plurality of metal wiring layers 20 are formed at the same level as the bit lines and have the same pattern as the bit lines. Therefore, the regularity of the metal wiring layers at the level where the bit lines are formed is not ruined even in the source contact region. Then, the metal wiring layers 23, 24 can be patterned in the same lithography process. Thus, the fabrication of the metal wiring layers 24 acting as source lines can be made easier without an unnecessary increase in the area. At the same time, the metal wiring layers 24 can connect the metal wiring layers 20 easily in the direction of the bit line.

Figure 5A:
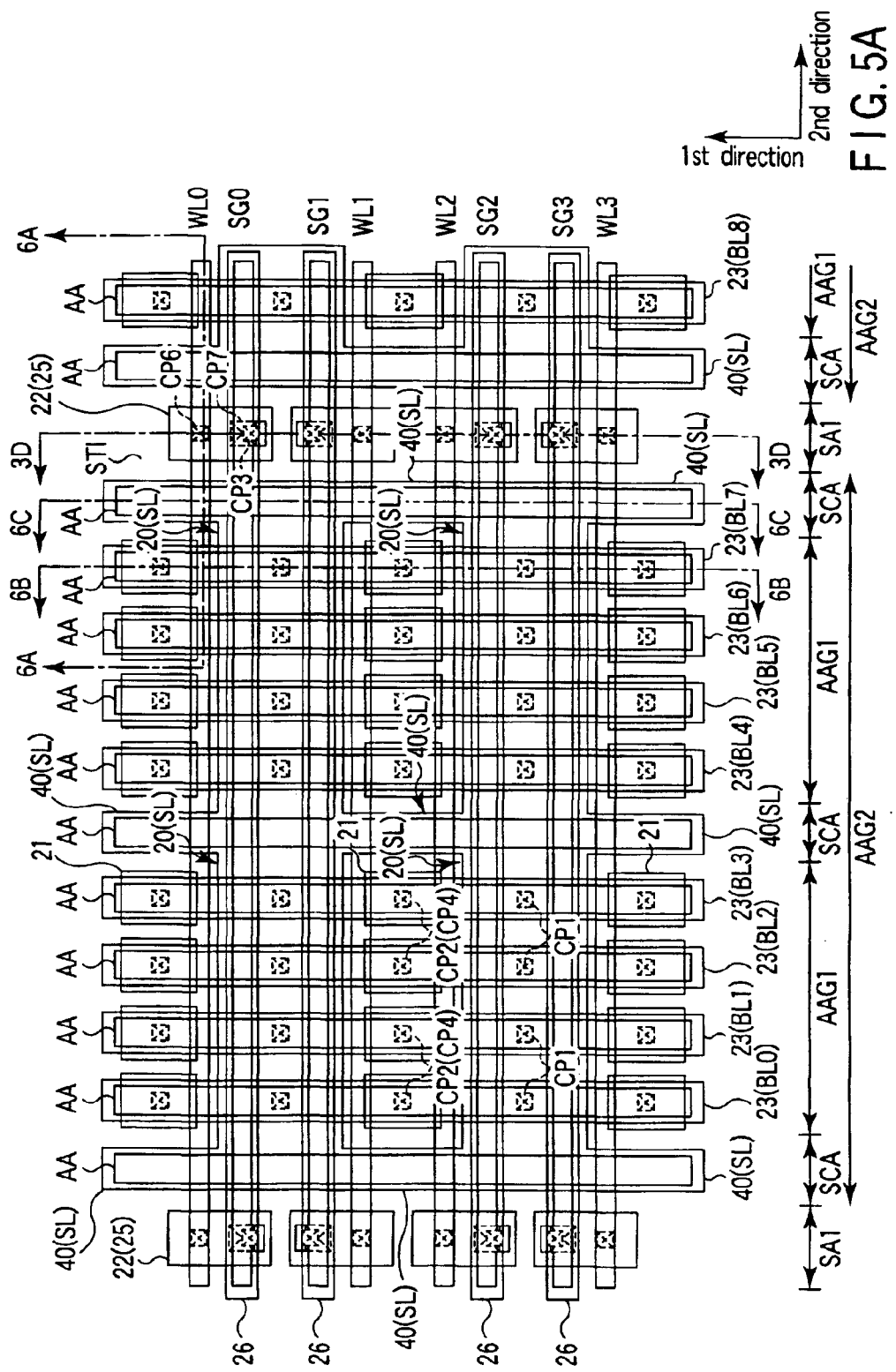
FIG. 5A is a plan view of a memory cell array included in a flash memory according to a second embodiment of the present invention.
Figure 5B:
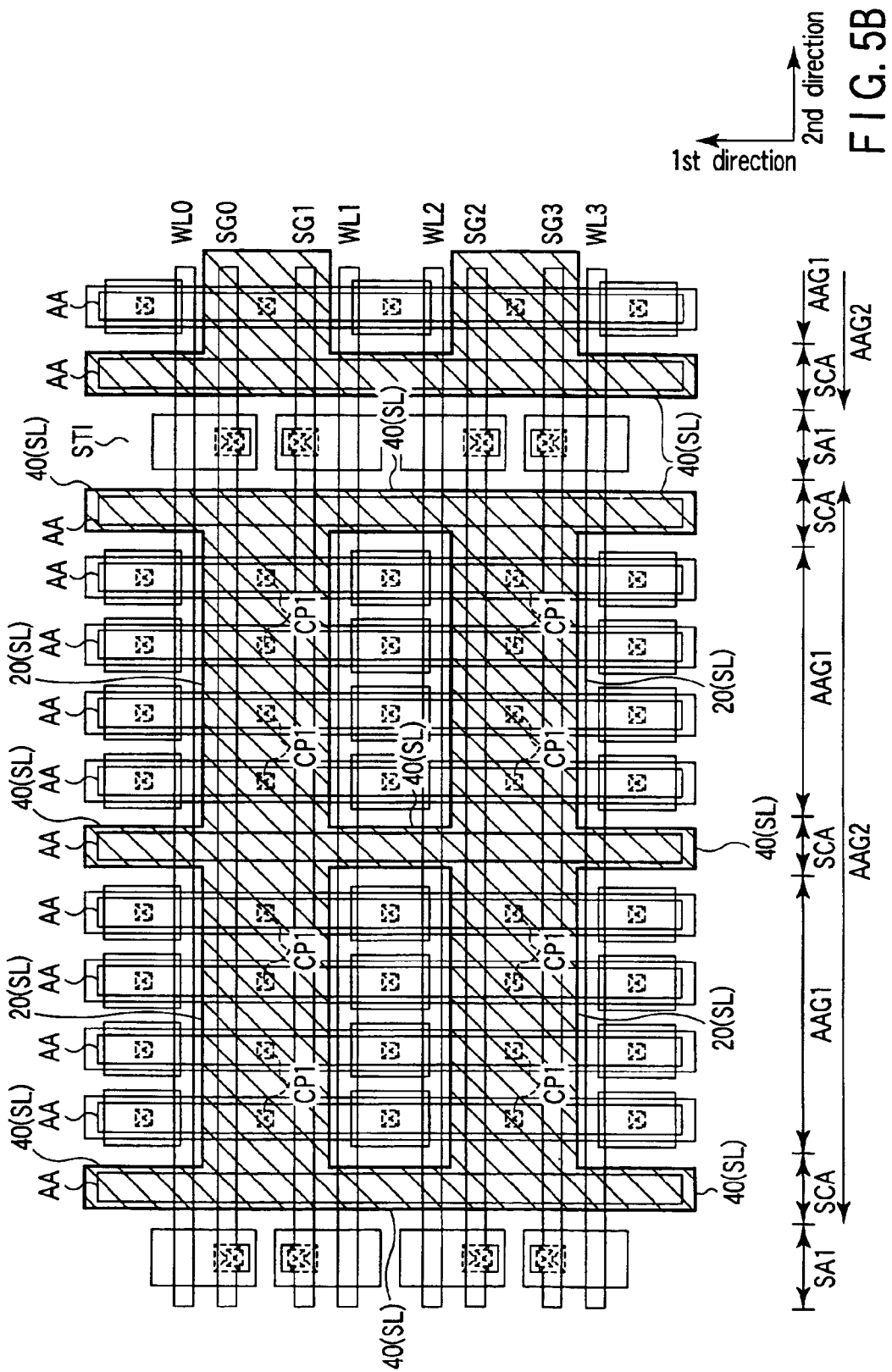
FIG. 5B is a plan view of a memory cell array included in a flash memory according to the second embodiment.

Next, a nonvolatile semiconductor memory device according to a second embodiment of the present invention will be explained. The second embodiment is such that the pattern of the source lines SL is changed in the first embodiment. Since the block diagram of a flash memory of the second embodiment is the same as that of FIG. 1, its explanation will be omitted. FIG. 5A is a plan view of a memory cell array included in a flash memory of the second embodiment. FIG. 5B is a plan view centering on the source line, with the metal wiring layers 26 of FIG. 5A not shown and the region of the source line SL represented by a shaded portion.

As shown in the figures, in a source contact region SCA, a metal wiring layer 40 connecting adjacent metal wiring layers 20 is formed. The metal wiring layer 40 is formed at the same level (the first layer) as the metal wiring layers 20. That is, the source line SL includes the metal wiring layers 20, 40. In other words, the source line SL is shaped like a ladder.

In the second embodiment, the metal wiring layers 24 in the first embodiment are removed and the metal wiring layers 26 are located just above the corresponding select gate lines SG.

Figure 6A:
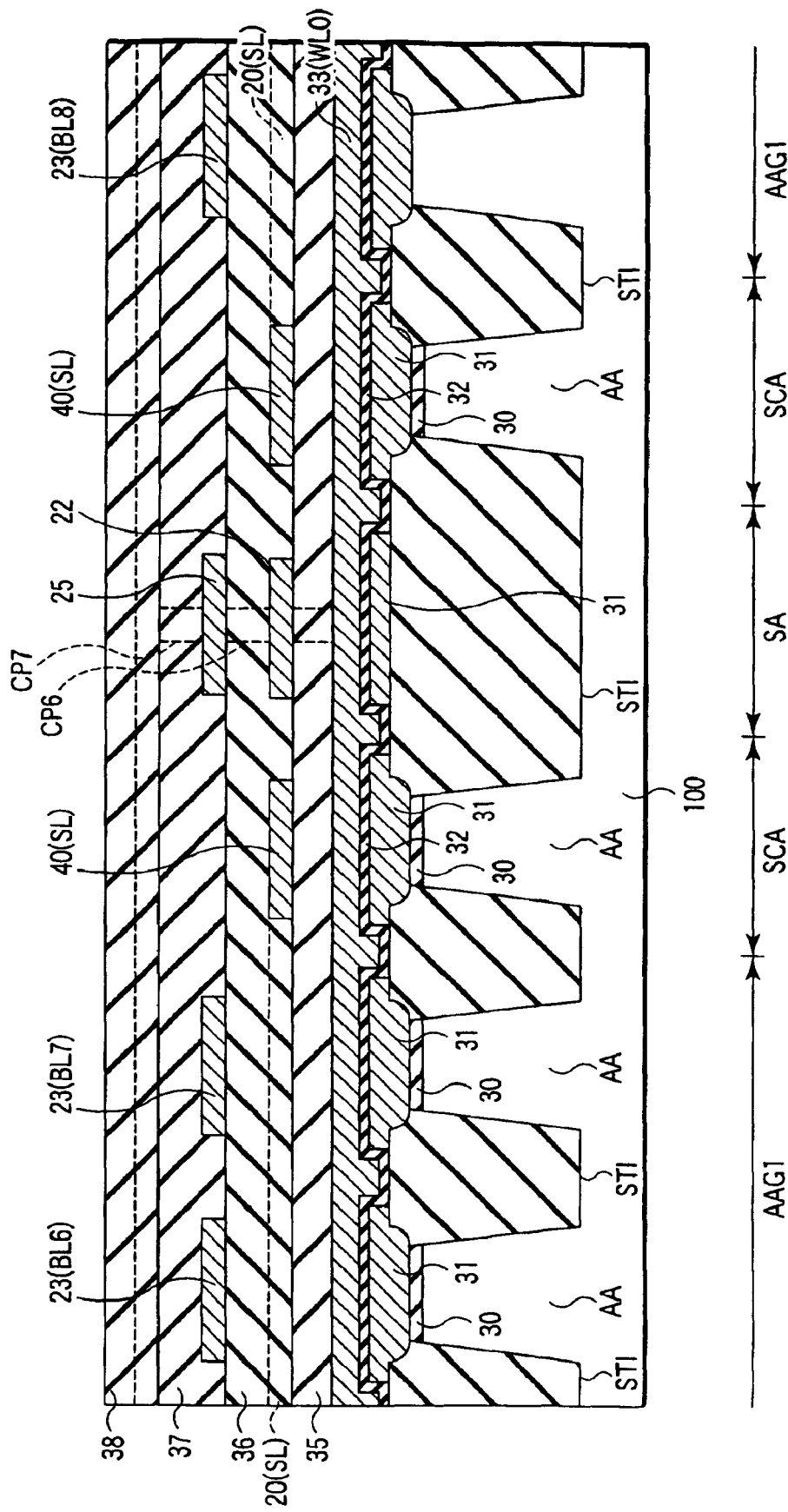
FIG. 6A is a sectional view taken along line 6A—6A of FIG. 5A.
Figure 6B:
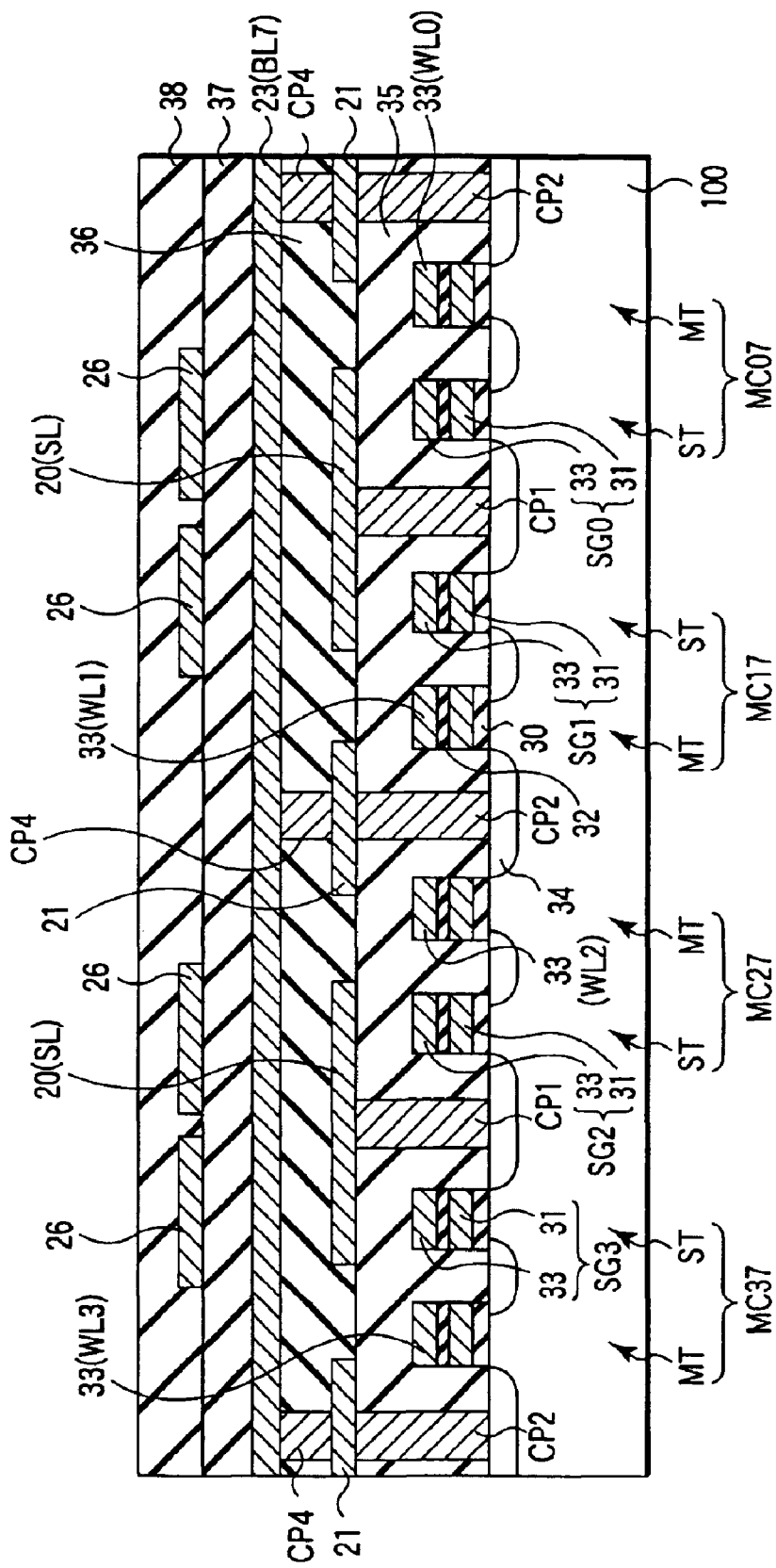
FIG. 6B is a sectional view taken along line 6B—6B of FIG. 5A.
Figure 6C:
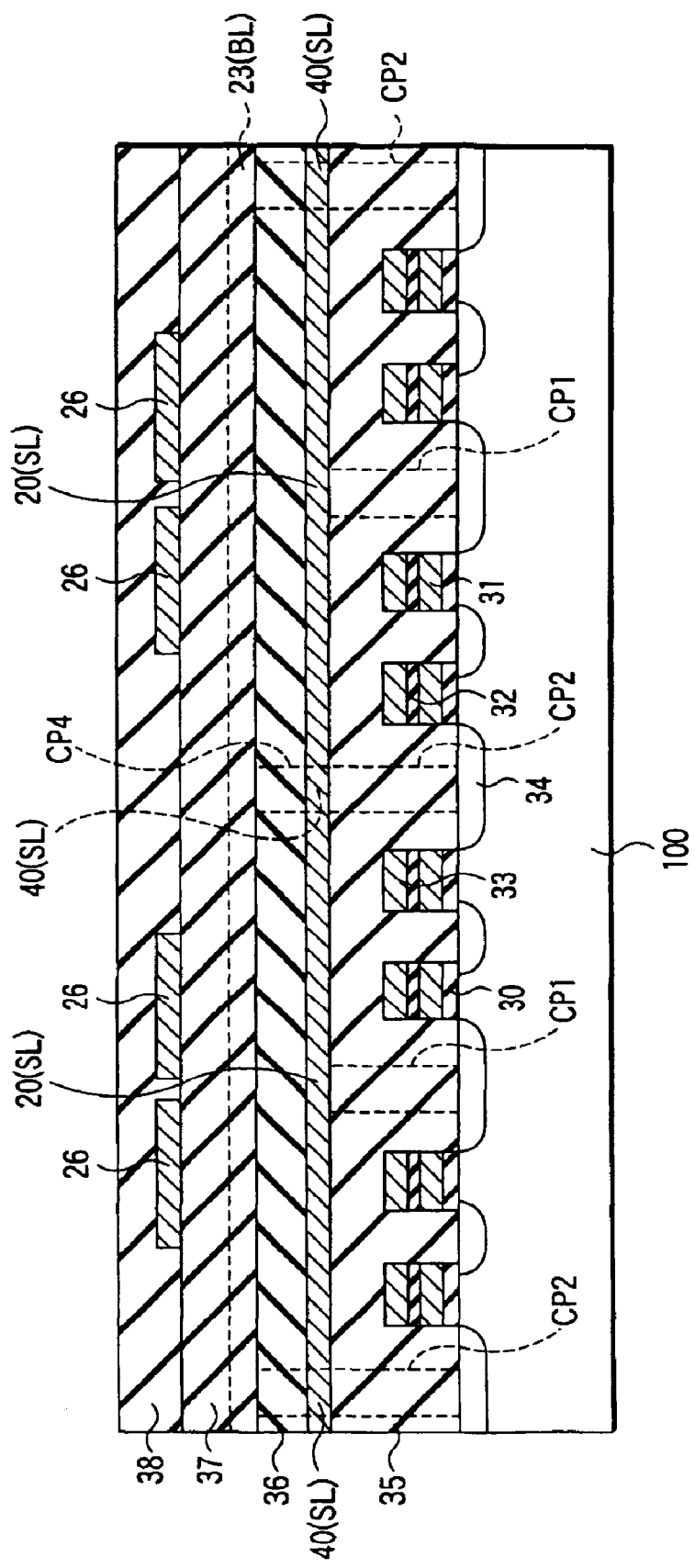
FIG. 6C is a sectional view taken along line 6C—6C of FIG. 5A.

Next, a cross-sectional structure of a flash memory according to the second embodiment will be explained. FIG. 6A is a sectional view taken along line 6A—6A of FIG. 5A. FIG. 6B is a sectional view taken along line 6B—6B of FIG. 5A. FIG. 6C is a sectional view taken along line 6C—6C of FIG. 5A.

As shown in the figures, in a source contact region SCA, a metal wiring layer 40 connected to metal wiring layers 20 is formed. That is, on an interlayer insulating film 35 on a region between two adjacent word lines, a metal wiring layer 40 is formed. Metal wiring layers 26 functioning as shunt wires for select gate lines are located just above the gate electrodes of the corresponding select transistors. Since the remaining configuration is the same as that of the first embodiment, its explanation will be omitted. Furthermore, since a cross-sectional structure of a stitch region taken along line 3D—3D of FIG. 5A is the same as that of FIG. 3D in the first embodiment except that the metal wiring layers 26 are moved to just above the gate electrodes of the select transistors, its explanation will be omitted.

The configuration of the second embodiment produces the effects explained in items (1), (4), and (5) in the first embodiment. It further produces the effect described in item (7):

(7) The Reliability of a Read Operation is Improved. ④

With the configuration of the second embodiment, as shown in FIGS. 5A and 5B, the source line SL includes the metal wiring layers 20, 40. A metal wiring layer 40 connects a plurality of metal wiring layers 20 provided for each contact plug CP1 in the same row. That is, the source line SL is not isolated in the direction of the bit line. Therefore, read current can flow not only in the direction of word line but also in the direction of bit line. At this time, the read current can flow in the direction of bit line without passing through a contact plug. As a result, the resistance of the source line SL can be decreased. Furthermore, the occurrence of electromigration at a contact plug can be suppressed.

Therefore, it is possible to suppress a rise in the potential of the source line SL in a read operation, which improves the reliability of the read operation of the flash memory.

Figure 7B:
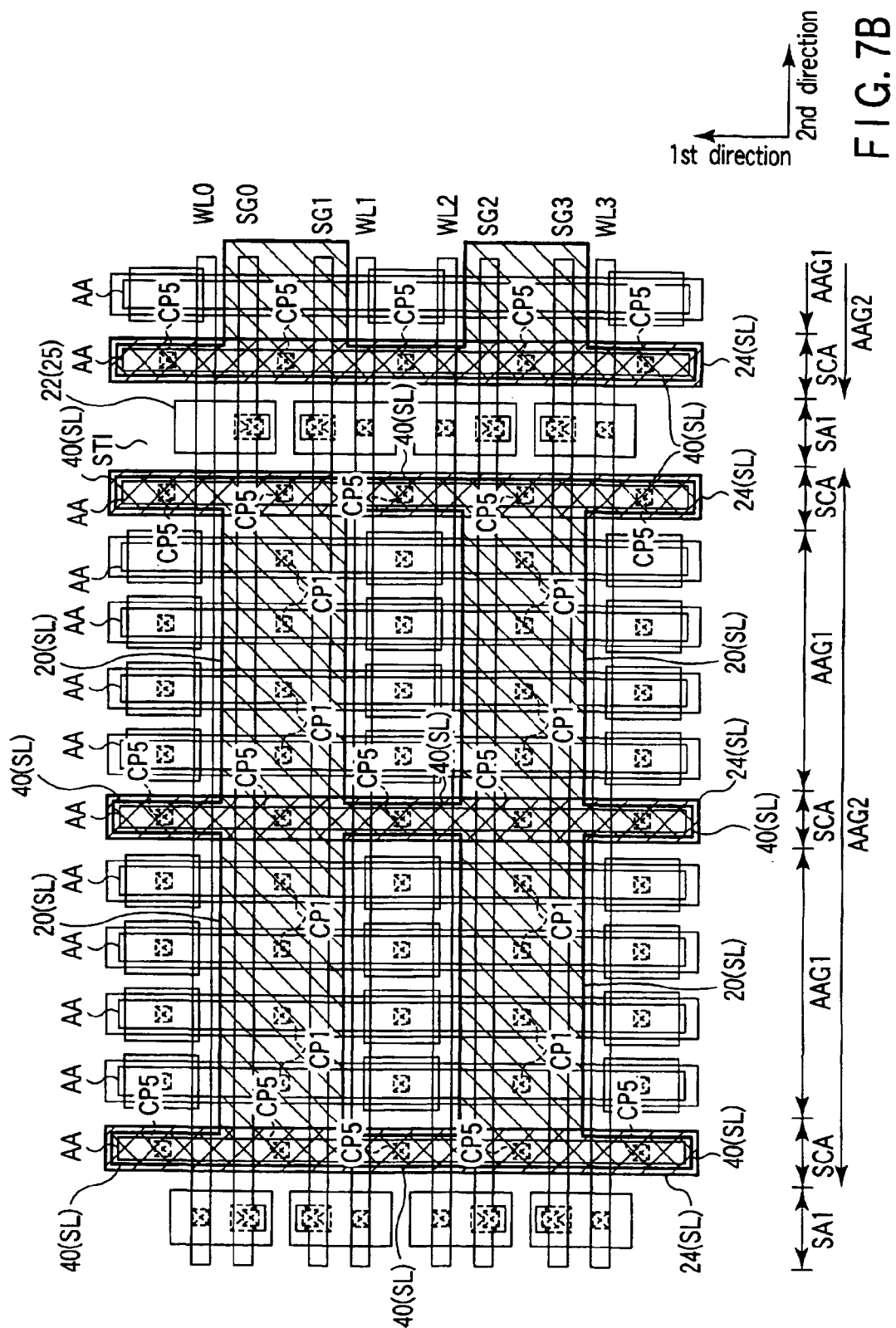
FIG. 7B is a plan view of a memory cell array included in a flash memory according to the third embodiment.

Next, a nonvolatile semiconductor memory device according to a third embodiment of the present invention will be explained. The third embodiment is such that the metal wiring layers 24 explained in the first embodiment are further provided in the second embodiment. Since the block diagram of a flash memory of the third embodiment is the same as that of FIG. 1, its explanation will be omitted. FIG. 7A is a plan view of a memory cell array included in a flash memory of the third embodiment. FIG. 7B is a plan view centering on the source line and metal wiring layers 24, with the metal wiring layers 26 of FIG. 7A not shown and the region of the source line SL and metal wiring layers 24 represented by a shaded portion.

As shown in the figures, a flash memory of the third embodiment is such that metal wiring layers 24 are formed in source contact regions SCA in FIG. 5B of the second embodiment. The metal wiring layers 24 are formed at the same level (second layer) as the metal wiring layers 23 acting as bit lines. The line width of a metal wiring layer 24 is the same as that of a metal wiring layer 23. In the source contact region SCA, the metal wiring layers 20, 40 and the metal wiring layers 24 are connected via contact plugs CP5. That is, the source line SL includes the metal wiring layers 20, 40, 24. The remaining configuration is the same as that of the second embodiment.

Figure 8A:
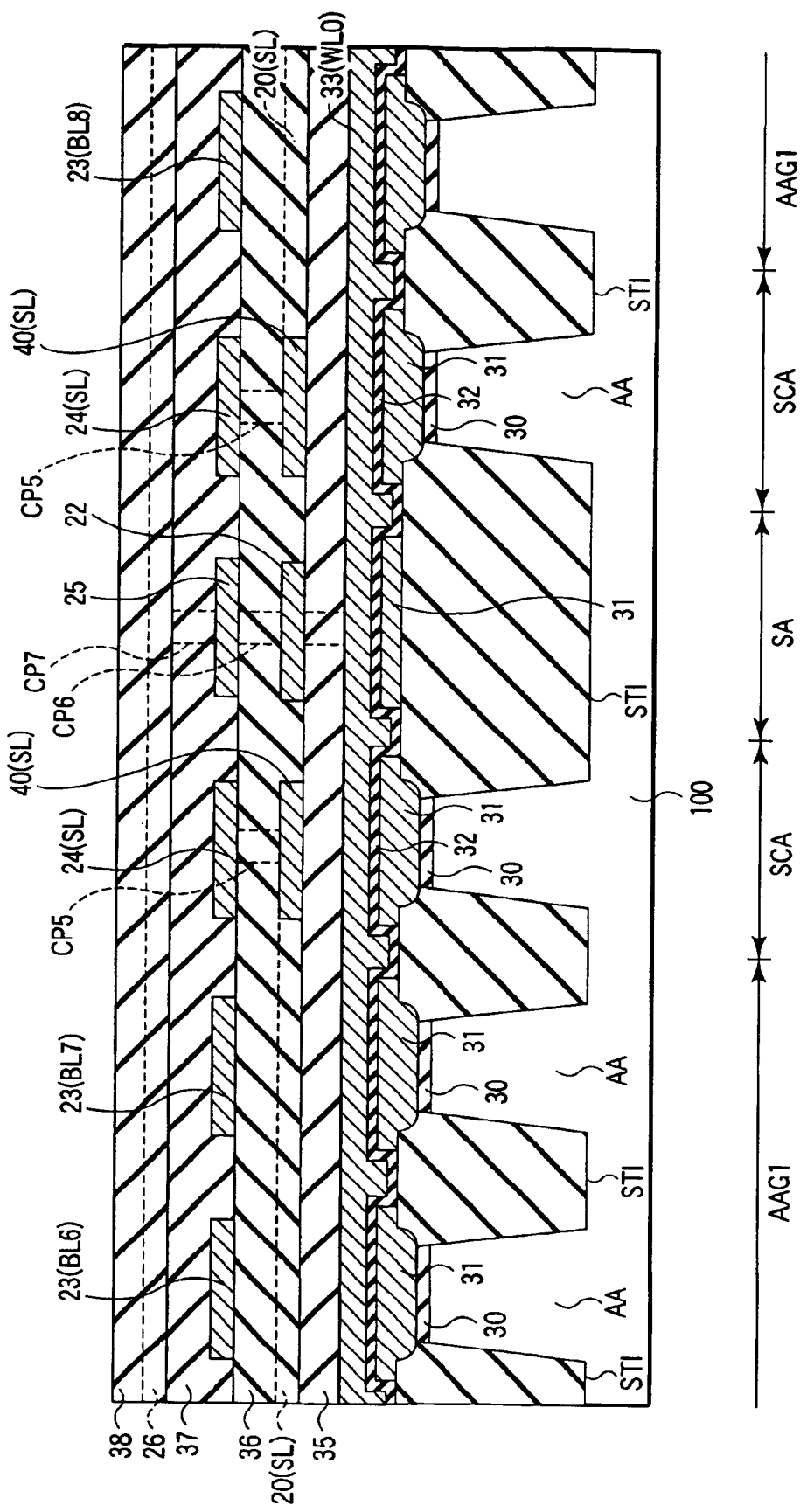
FIG. 8A is a sectional view taken along line 8A—8A of FIG. 7A.
Figure 8B:
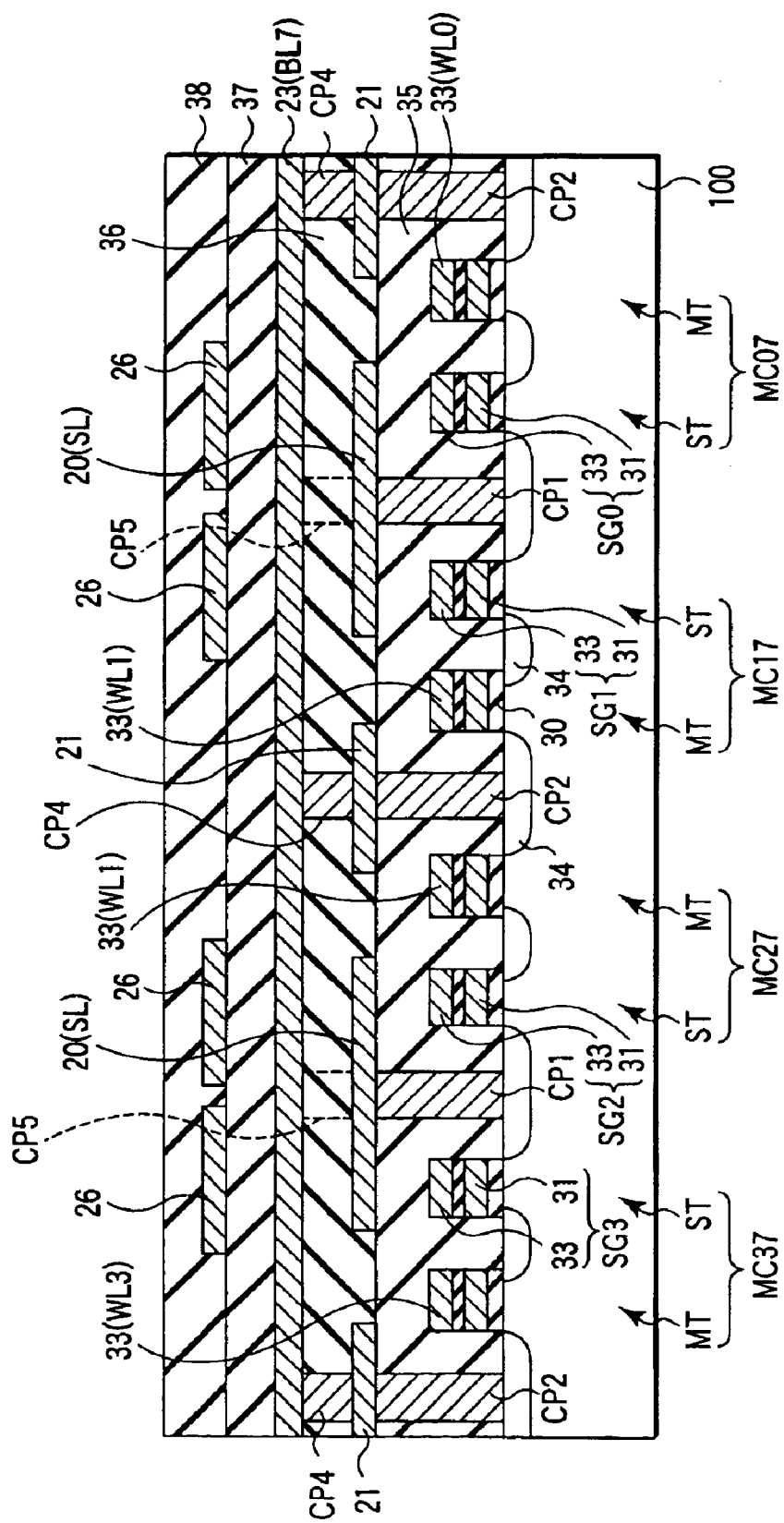
FIG. 8B is a sectional view taken along line 8B—8B of FIG. 7A.
Figure 8C:
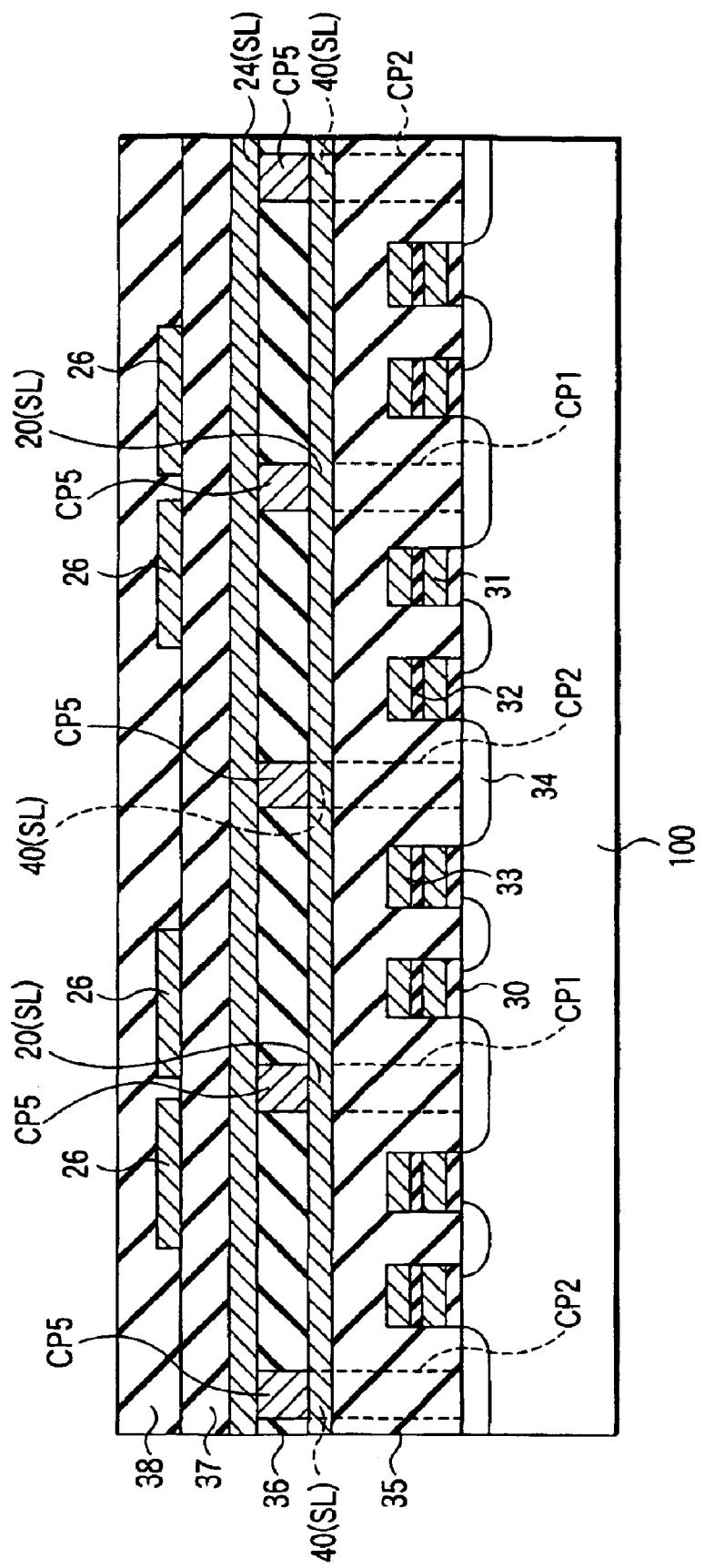
FIG. 8C is a sectional view taken along line 8C—8C of FIG. 7A.

Next, a cross-sectional structure of a flash memory according to the third embodiment will be explained. FIG. 8A is a sectional view taken along line 8A—8A of FIG. 7A. FIG. 8B is a sectional view taken along line 8B—8B of FIG. 7A. FIG. 8C is a sectional view taken along line 8C—8C of FIG. 7A.

As shown in the figures, in a source contact region SCA, a metal wiring layer 24 is formed on metal wiring layers 20, 40. That is, on an interlayer insulating film 36 in a source contact region SCA, a metal wiring layer 24 is formed. Then, contact plugs CP5 formed in the interlayer insulating film 36 connect the metal wiring layers 20, 40 and the metal wiring layers 24. The contact plugs CP5 are formed so as to be in the same row as the contact plugs CP1 and in the same row as the contact plugs CP2, CP4. The contact plugs CP5 may be formed in the position of either the metal wiring layer 20 or 40. The remaining configuration is the same as that of the second embodiment, its explanation will be omitted. Furthermore, since a cross-sectional structure of the stitch region taken along line 3D—3D of FIG. 7A is the same as that of FIG. 3D in the first embodiment except that the metal wiring layers 26 are moved to just above the gate electrodes of the select transistors, its explanation will be omitted.

The configuration of the third embodiment produces the effects explained in items (1), (3), (4), (5), and (6) in the first embodiment and in item (7) in the second embodiment. It further produces the effect described in item (8):

(8) The Reliability of a Read Operation is Improved. ⑤

With the configuration of the third embodiment, as shown in FIGS. 7A and 7B, the source line SL includes the first-layer metal wiring layer and the second-layer metal wiring layer. The first-layer metal wiring layer and the second-layer metal wiring layer are connected to each other via the contact plugs CP5. This is the same as in the first embodiment. Further in the configuration of the third embodiment, the first-layer metal wiring layer includes the metal wiring layers 20, 40. Thus, in the source contact region SCA, the source line is so formed that it is shaped like a stripe extending in the direction of the bit line. Accordingly, contact plugs CP5 connecting the first-layer metal wiring layers 20, 40 and the second-layer metal wiring layers 24 can be formed everywhere in the source contact region SCA. While in FIGS. 7A and 7B, the number of contact plugs CP5 is five every four word lines and select gate lines, the number may be increased as needed.

Thus, the contact plugs are liable to deteriorate due to the concentration of current. When the source line is made of the first-layer metal wiring layer and the second-layer metal wiring layer, if the number of contact plugs connecting them is small, current can concentrate on the contact plugs, resulting in the destruction of the contract plugs. The destruction of the contact plugs would increase the resistance of the source line SL.

With the configuration of the third embodiment, however, the number of contact plugs CP5 can be increased remarkably, which prevents the contact plugs CP5 from being destroyed. Accordingly, the resistance of the source line SL is kept lower, which improves the reliability of the read operation.

Figure 9B:
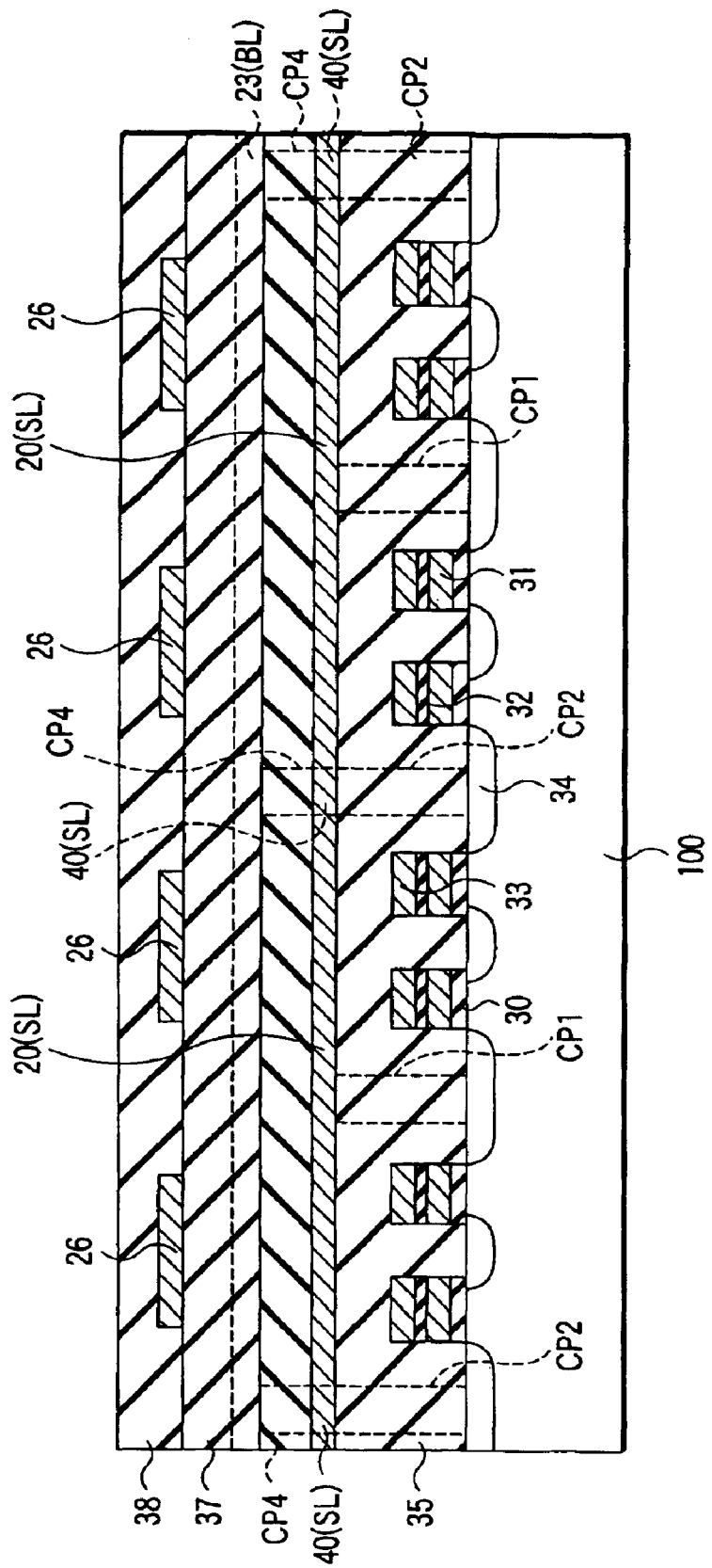
FIG. 9B is a sectional view taken along line 9B—9B of FIG. 9A.

Next, a nonvolatile semiconductor memory device according to a fourth embodiment of the present invention will be explained. The fourth embodiment is a combination of the first and second embodiments. Since the block diagram of a flash memory of the fourth embodiment is the same as that of FIG. 1, its explanation will be omitted. FIG. 9A is a plan view of a memory cell array included in a flash memory of the fourth embodiment. FIG. 9B is a sectional view taken along line 9B—9B of FIG. 9A. Since sectional views taken along line 6A—6A, line 3B—3B, and line 3D—3D of FIG. 9A are the same as that of FIG. 6A in the second embodiment, that of FIG. 3B in the first embodiment with the contact plugs CP5 removed, and that of FIG. 3D in the first embodiment, respectively, they will be omitted.

As shown in the figures, in the configuration shown in FIGS. 5A and 5B of the second embodiment, the metal wiring layer 26 passes through the central part of the memory cells MC as in the first embodiment. In other words, the metal wiring layer 26 is located in a region between the central part of the word line and the central part of the select gate line corresponding to the word line.

The configuration of the fourth embodiment produces the effects explained in items (1), (2), (4), and (5) in the first embodiment and in item (7) in the second embodiment.

Figure 10A:
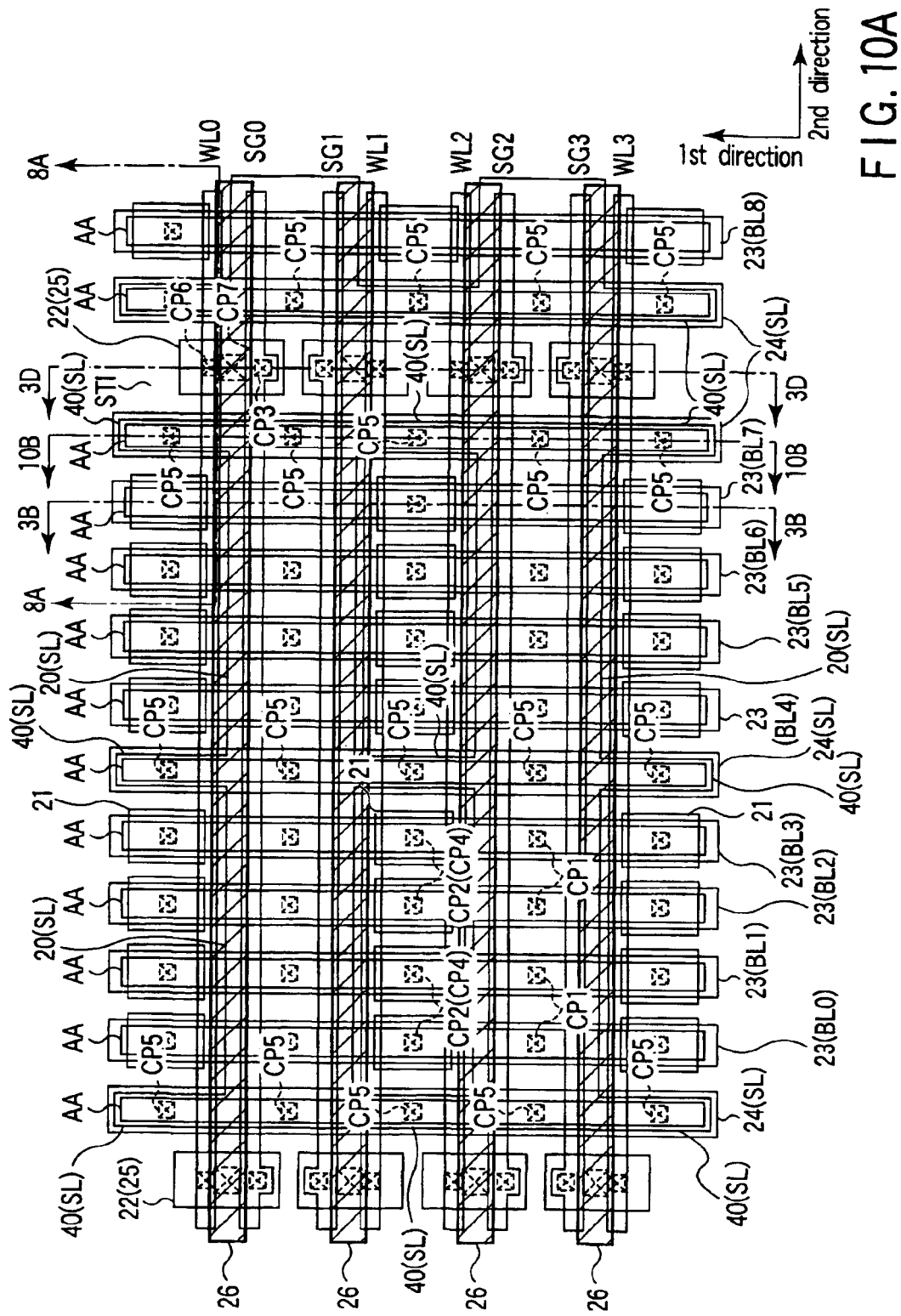
FIG. 10A is a plan view of a memory cell array included in a flash memory according to a fifth embodiment of the present invention.
Figure 10B:
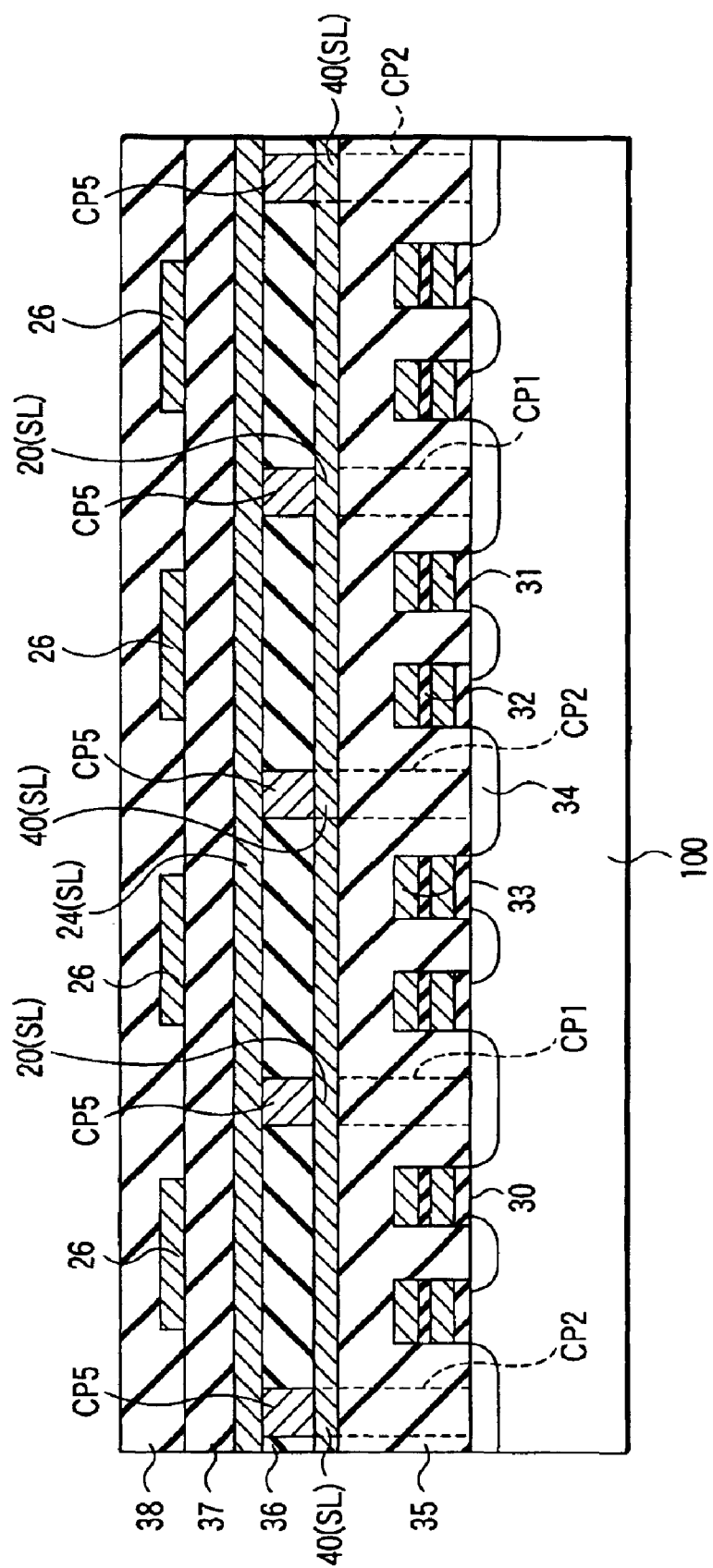
FIG. 10B is a sectional view taken along line 10B—10B of FIG. 10A.

Next, a nonvolatile semiconductor memory device according to a fifth embodiment of the present invention will be explained. The fifth embodiment is a combination of the first and third embodiments. Since the block diagram of a flash memory of the fifth embodiment is the same as that of FIG. 1, its explanation will be omitted. FIG. 10A is a plan view of a memory cell array included in a flash memory of the fifth embodiment. In FIG. 10A, the metal wiring layers 26 formed at the highest level are represented by shaded portions. FIG. 10B is a sectional view taken along line 10B—10B of FIG. 10A. Since sectional views taken along line 8A—8A, line 3B—3B, and line 3D—3D of FIG. 10A are the same as that of FIG. 8A in the third embodiment, and that of FIG. 3B and that of FIG. 3D in the first embodiment, respectively, they will be omitted.

As shown in the figures, in the configuration shown in FIGS. 7A and 7B of the third embodiment, the metal wiring layer 26 passes through the central part of the memory cells MC as in the first embodiment. In other words, the metal wiring layer 26 is located in a region between the central part of the word line and the central part of the select gate line corresponding to the word line.

The configuration of the fifth embodiment produces the effects explained in items (1) to (6) in the first embodiment, and in item (7) in the second embodiment, and in item (8) in the third embodiment.

Figure 11:
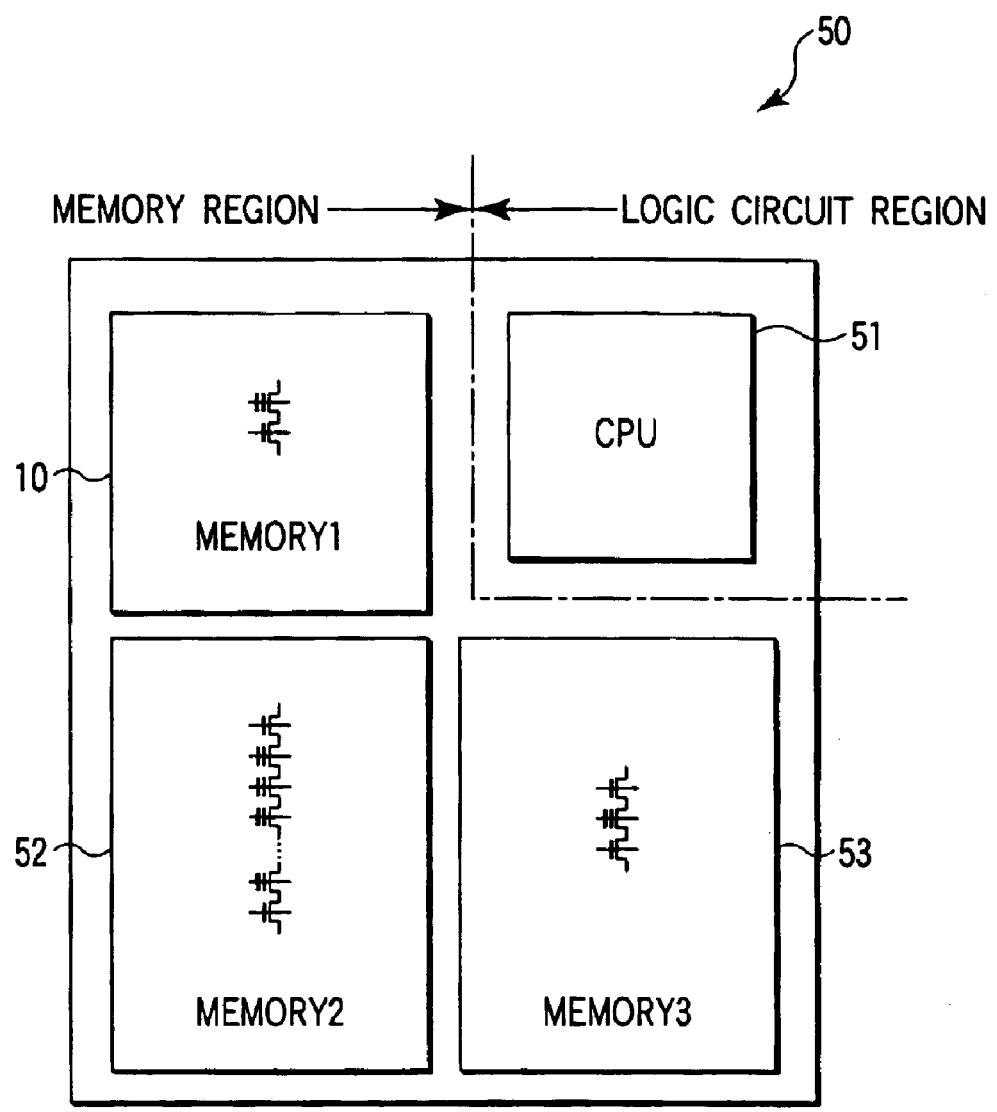
FIG. 11 is a block diagram of a system LSI including a flash memory according to a sixth embodiment of the present invention.

Next, a nonvolatile semiconductor memory device according to a sixth embodiment of the present invention will be explained by reference to FIG. 11. FIG. 11 is a block diagram of a system LSI including a nonvolatile semiconductor memory device of the sixth embodiment.

As shown in the figure, a system LSI 150 has a logic circuit region and a memory region. In the logic circuit region, for example, a CPU 51 is provided. In the memory region, there are provided a flash memory 10 explained in the first to fifth embodiments, a NAND flash memory 52, and a flash memory 53 where a memory cell includes three MOS transistors.

With the configuration of the sixth embodiment, the flash memory produces the effects described in items (1) to (8). In addition, the configuration produces the effect, (9) simplifying the manufacture of system LSIs. In the sixth embodiment, a memory cell has two transistors connected in series. The memory cells of this type have a larger current driving capability than those of other types. Thus, the flash memory 10 is suitable for high-speed reading. When the flash memory is embedded on the same chip as the CPU 51, the flash memory 10 can be used as a ROM that stores the firmware for the CPU 51. In this respect, use of flash memories according to the first to fifth embodiments enables the select gate lines to be driven at high speeds and reduces the wiring resistance of the source. This makes it possible to read the data from the flash memory 10 at higher speeds. As a result, the CPU 51 can read the data directly without the intervention of RAM or the like, which is advantageous in configuring a system LSI.

The flash memory 10 explained in the first to fifth embodiments can be formed in the same manufacturing processes as the NAND flash memory 52 and flash memory 53. For instance, the process of ion implantations to form an impurity diffused layer, the process of patterning gate electrodes and metal wiring layers, and the like can be carried out at the same time for three types of flash memories. In this case, for example, the impurity diffused layers have the same concentration in the individual memories. Since three flash memories provided in an LSI are formed in the same processes, the manufacturing of LSIs can be simplified.

For example, in the logic circuit region, the CPU 51 may be formed on an SOI substrate and, in the memory region, the individual memories 10, 52, 53 may be formed on a bulk silicon substrate.

As described above, with the nonvolatile semiconductor memory devices according to the first to sixth embodiments, the operating speed of the flash memory can be enhanced and the manufacturing processes can be simplified. Specifically, the shunt wires 26 for the select gate lines SG0 to SGm are formed so as to pass through the central part of the corresponding memory cells. That is, the shunt wires 26 are arranged at equal intervals. As a result, the parasitic capacitance between the shunt wires 26 decreases, which improves the operating speed.

A plurality of metal wiring layers 20 isolated by stitch regions in the direction of the word line are connected by metal wiring layers 24 in the direction of the bit line. As a result, the resistance of the source line SL is decreased, which improves the reliability of the read operation. Furthermore, forming the source line SL into a ladder shape enables the metal wiring layers 20, a part of the source line SL, to be formed continuously in the direction of the bit line.

The configuration related to the source line produces a noticeable effect when shunt wires for the select gate lines are used, as described in the above embodiments. A shut wire has to make contact with the gate electrode of a select transistor in any position. The contact region corresponds to a stitch region in the above embodiments. In the stitch region, a contact plug for connecting the gate electrode of a select transistor and a shunt wire and a metal wiring layer are formed. Thus, the source line cannot pass through the stitch region, with the result that the source line breaks in the stitch region. That is, the source line is isolated in each region between stitch regions. In this case, current flowing through the source line flows through wires in the direction of the bit line. Then, the current density in the contact plugs connected to the source line becomes very large, which degrades the reliability of the contact with the source line. Furthermore, the resistance of the source line itself increases, which causes the problem of increasing the potential of the source line in the read operation.

With the configuration of the present invention, however, providing the metal wiring layers 24 or/and the metal wiring layers 40 causes the source line to be formed continuously in the direction of the bit line. Thus, although the shunt wires for select gate lines are used, this makes it possible to suppress a rise in the potential of the source line and improve the reliability of the source line contacts.

As described in the above embodiments, the configuration produces a noticeable effect in the case of a flash memory having memory cells including memory cell transistors whose drains are connected to bit lines and select transistors whose sources are connected to the source line. Since the memory cell transistors have a negative threshold value in an erased state, they are in the on state, forming channels. As a result, when all the memory cells are in the erased state, the capacitances of the channel portions of the memory cell transistors and the capacitances of the diffused layers between the memory cell transistors and the select transistors are added to capacitance of the bit lines. When they are compared with a memory cell array of the same size, the capacitances of the bit lines of the present embodiment are larger than those in a NOR flash memory or a NAND flash memory. That is, the amount of current flowing through the source line becomes larger in a read operation. Therefore, an improvement in the reliability of the contacts of the source line and a decrease in the source line resistance as in the embodiments of the present invention are very effective in overcoming the above drawback.

In the above embodiments, a source contact region SCA is provided every four columns of memory cells and a stitch region SA1 is provided every eight columns of memory cells. The rate at which source contact regions SCA and stitch regions are provided may be changed according to the required read speed as follows: every 64 columns of memory cells, every 128 columns of memory cells, or every 256 columns of memory cells.

Figure 12B:
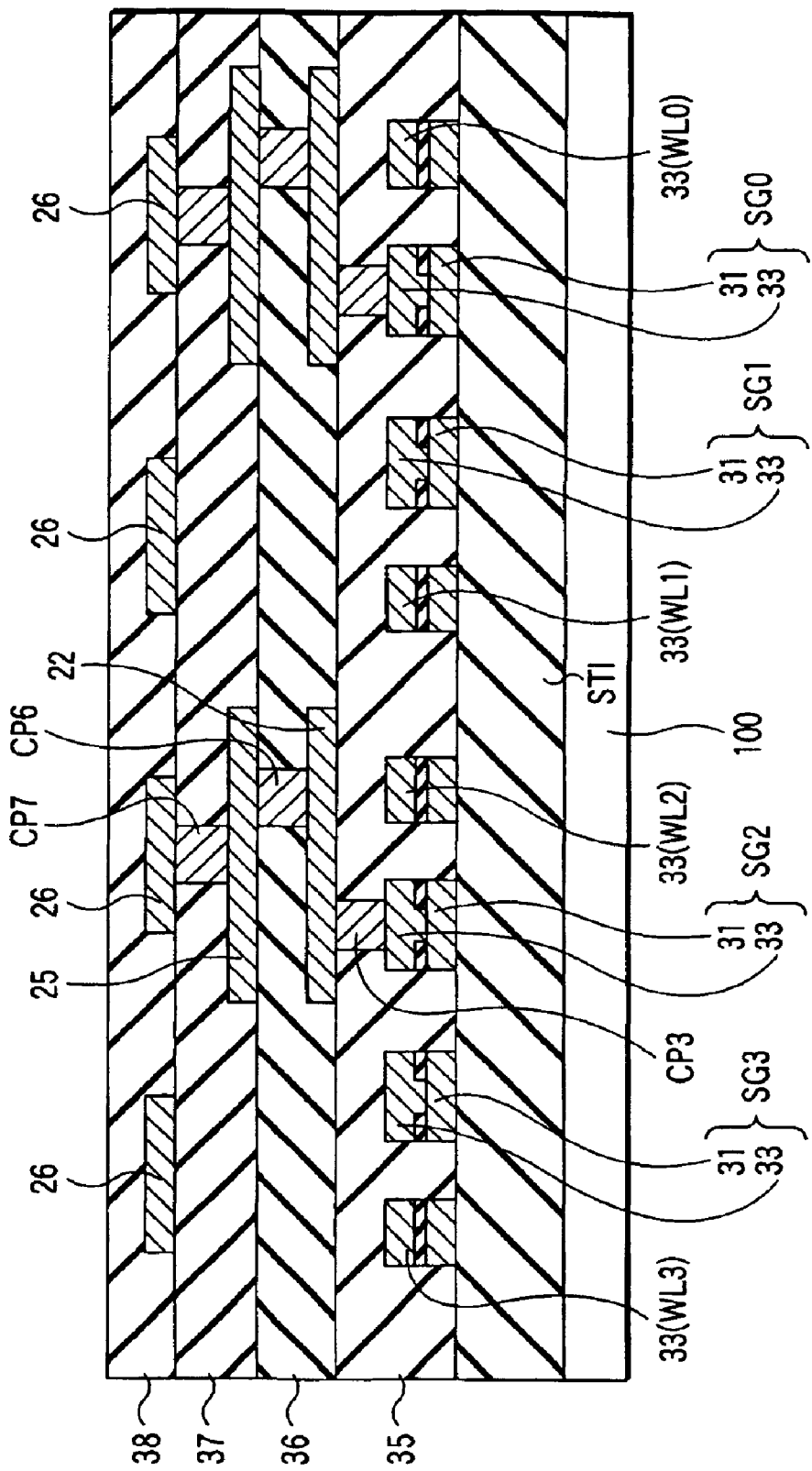
FIG. 12B is a sectional view taken along line 12B—12B of FIG. 12A.
Figure 12C:
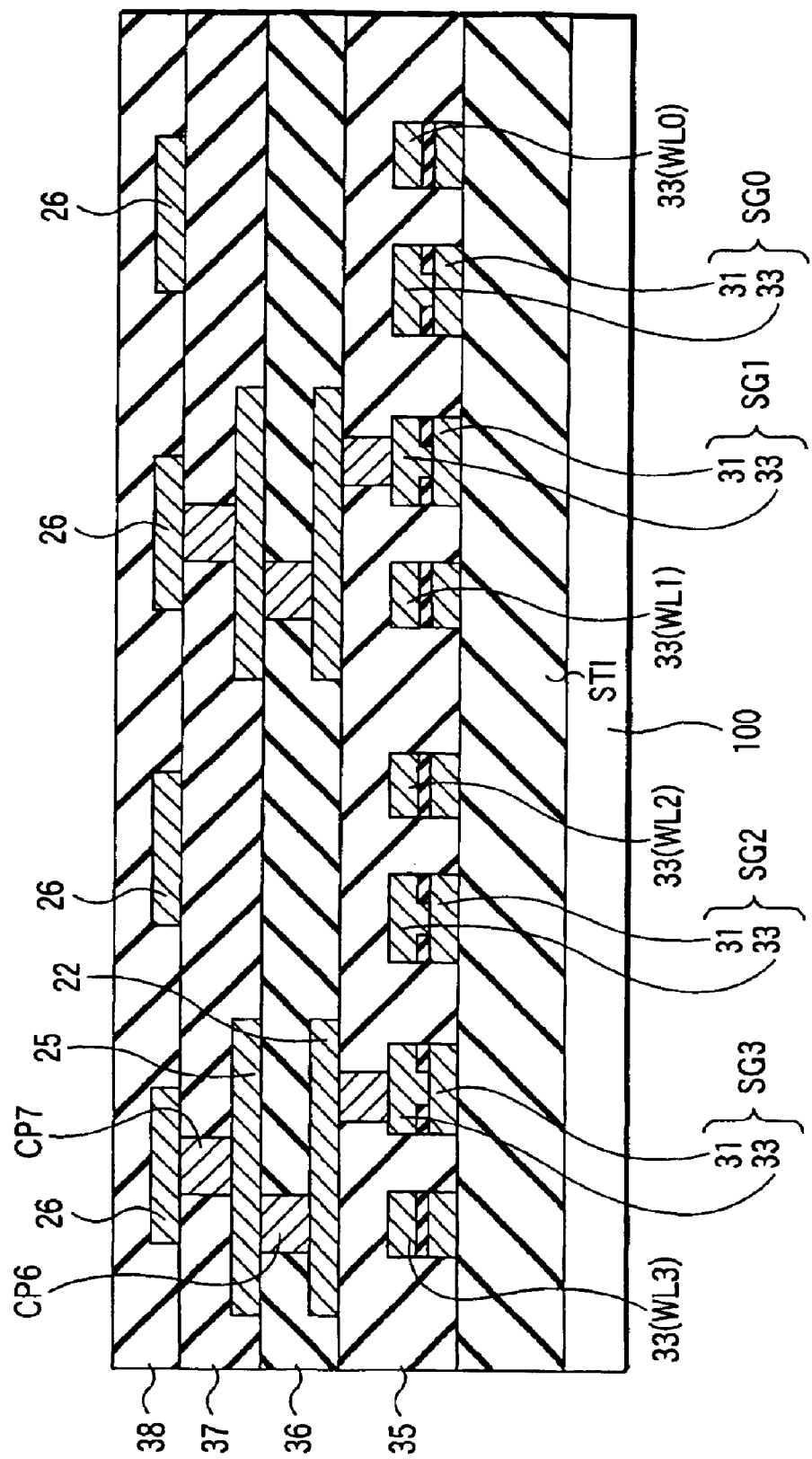
FIG. 12C is a sectional view taken along line 12C—12C of FIG. 12A.

Furthermore, in the first to fifth embodiments, all the shunt wires 26 have been connected to a shunt region SA2. A stitch region SA1 may be formed in a pattern as shown in FIG. 12A. FIG. 12A is a plan view centering on a stitch region SA1, with only word lines, select gate lines, metal wiring layers 22, 25, and shunt wires 26 shown. The remaining wiring patterns are the same as explained in the first to fifth embodiments. FIGS. 12B and 12C are sectional views taken along line 12B—12B and along line 12C—12C, respectively, in FIG. 12A.

As shown in the figure, in a stitch region SA1, only some of the shunt wires 26 are connected to the shunt regions SA2 of select gate lines. More specifically, in one stitch region, only the select gate lines SG0, SG2, SG4, . . . at even-numbered addresses are connected to the shunt wires 26. In an adjacent different stitch region, only the select gate lines SG1, SG3, SG5, . . . at odd-numbered addresses are connected to the shunt wires 26.

As described above, the select gate lines and shunt wires 26 are connected in such a manner that even-numbered addresses and odd-numbered addresses alternate with each other, which allows a margin in fabricating the gates in a stitch region SA1. In this method, an attempt to make the rate at which select gate lines are connected to shunt wires 26 almost equal to that in the first to fifth embodiments requires twice the number of stitch regions 26. This makes the chip size larger. However, in the present method, the fabrication of the gates in a stitch region becomes easier, which simplifies the fabrication processes. This contributes an improvement in the fabrication yield, which reduces the chip cost.

Figure 13A:
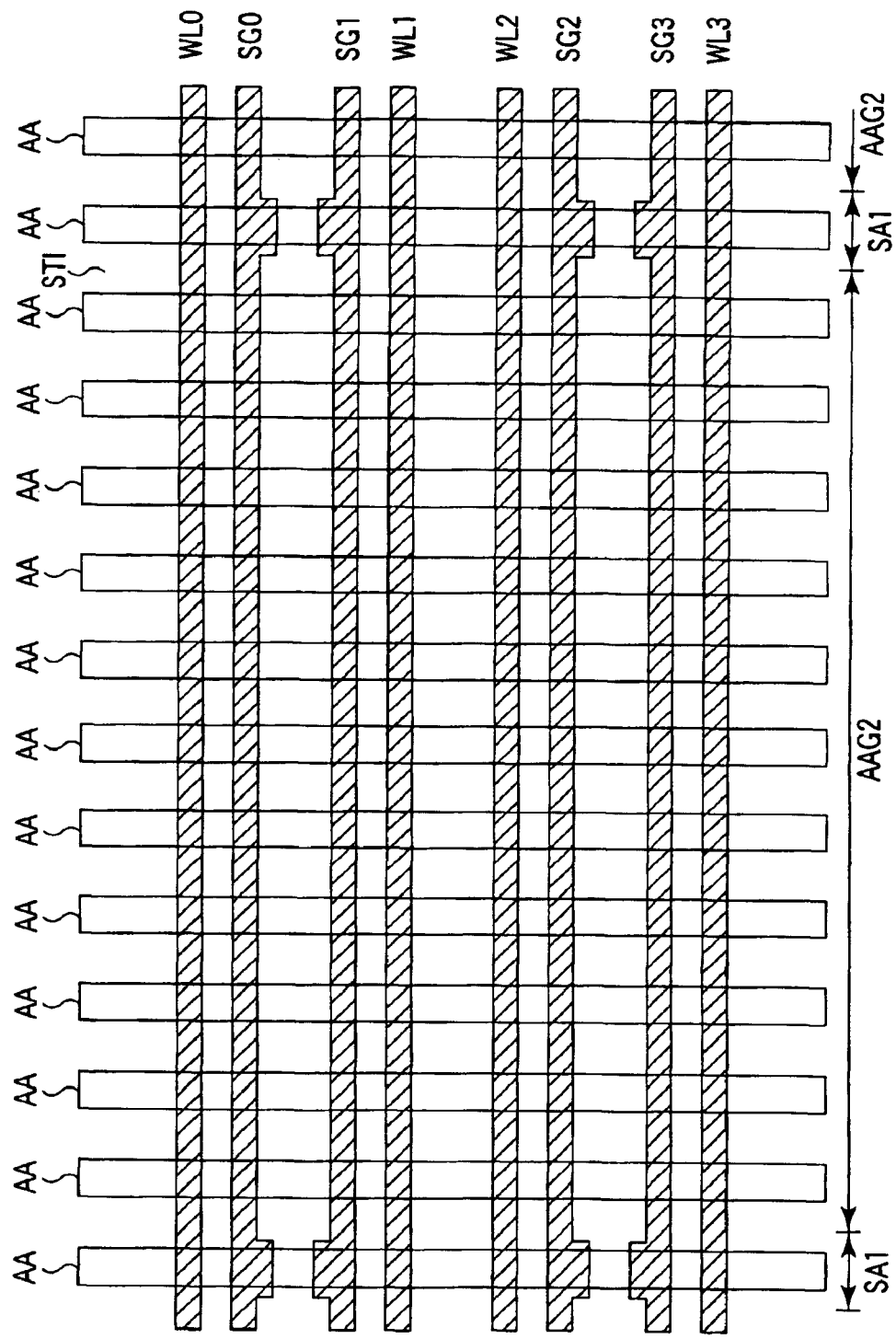
FIG. 13A is a plan view of a flash memory according to a second modification of the first to sixth embodiments.

In the first to fifth embodiments, an element region AA has not been formed in a stitch region SA1. However, as shown in a plan view of FIG. 13A, an element region AA may be formed in a stitch region SA1. In FIG. 13A, only element regions AA, select gate lines, and word lines are shown.

In this case, in a photolithography process of forming element regions AA, the regularity of the pattern is not ruined in the stitch region. Therefore, when contacts are formed in the stitch region, element regions AA should be put in the stitch region if there is no damage to the gates and below them.

Figure 13B:
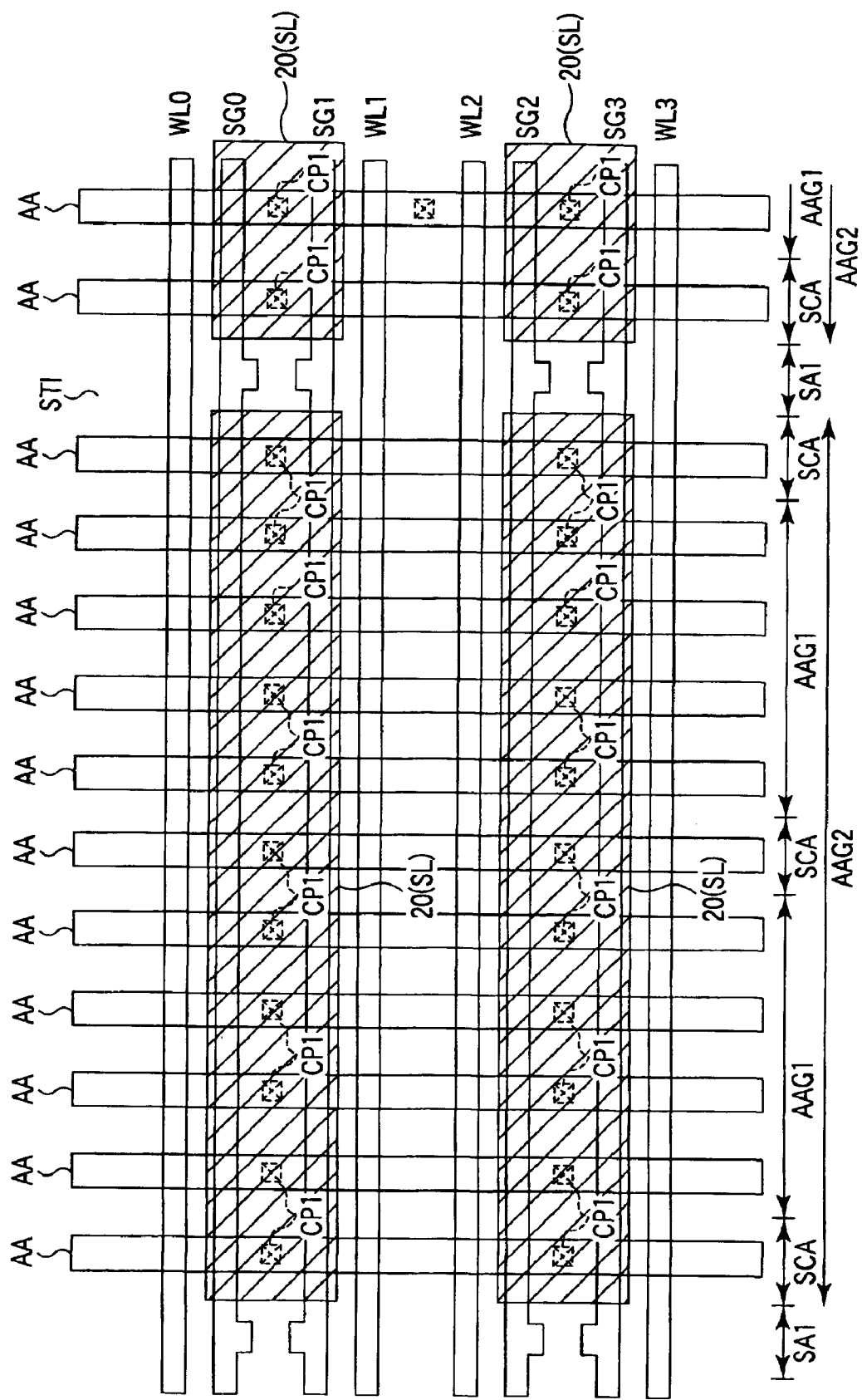
FIG. 13B is a plan view of a flash memory according to a third modification of the first to sixth embodiments.

Furthermore, as shown in FIG. 13B, contact CP1 may be formed in a source contact region SCA. FIG. 13B is a plan view of element regions AA, select gate lines, word lines, and source lines. In the first to firth embodiments, a contact plug CP1 has not been formed in the source contact region SCA. Since an element region AA in the source contact region SCA is isolated electrically from another element region AA, contact plugs CP1 may be formed in the source contact region SCA. In this case, because the regularity in the pattern of the contact plugs CP1 is maintained, the formation of the contact plugs CP1 is desirable to improve the reliability of the photolithography process.

Figure 14A:
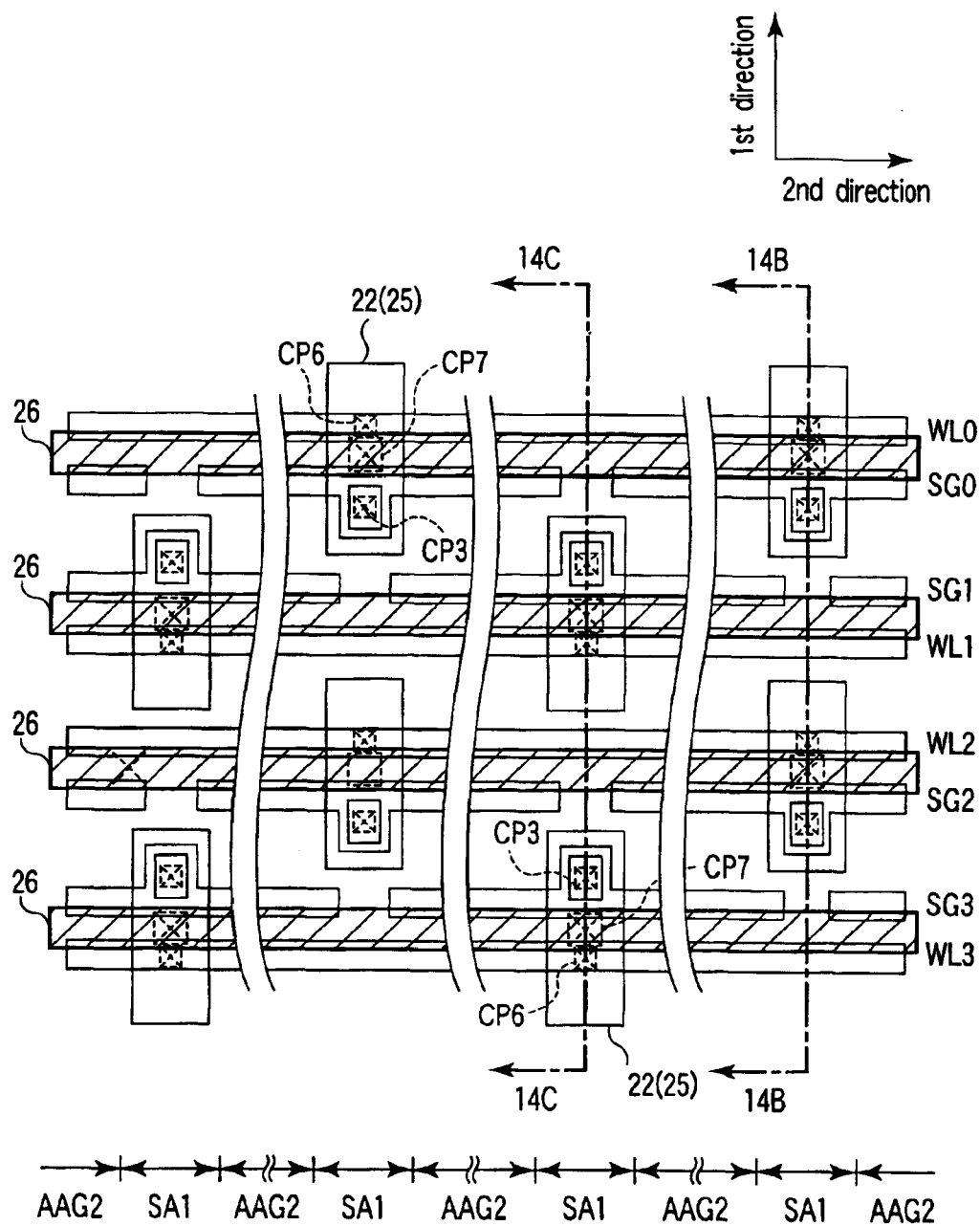
FIG. 14A is a plan view of a flash memory according to a fourth modification of the first to sixth embodiments.
Figure 14B:
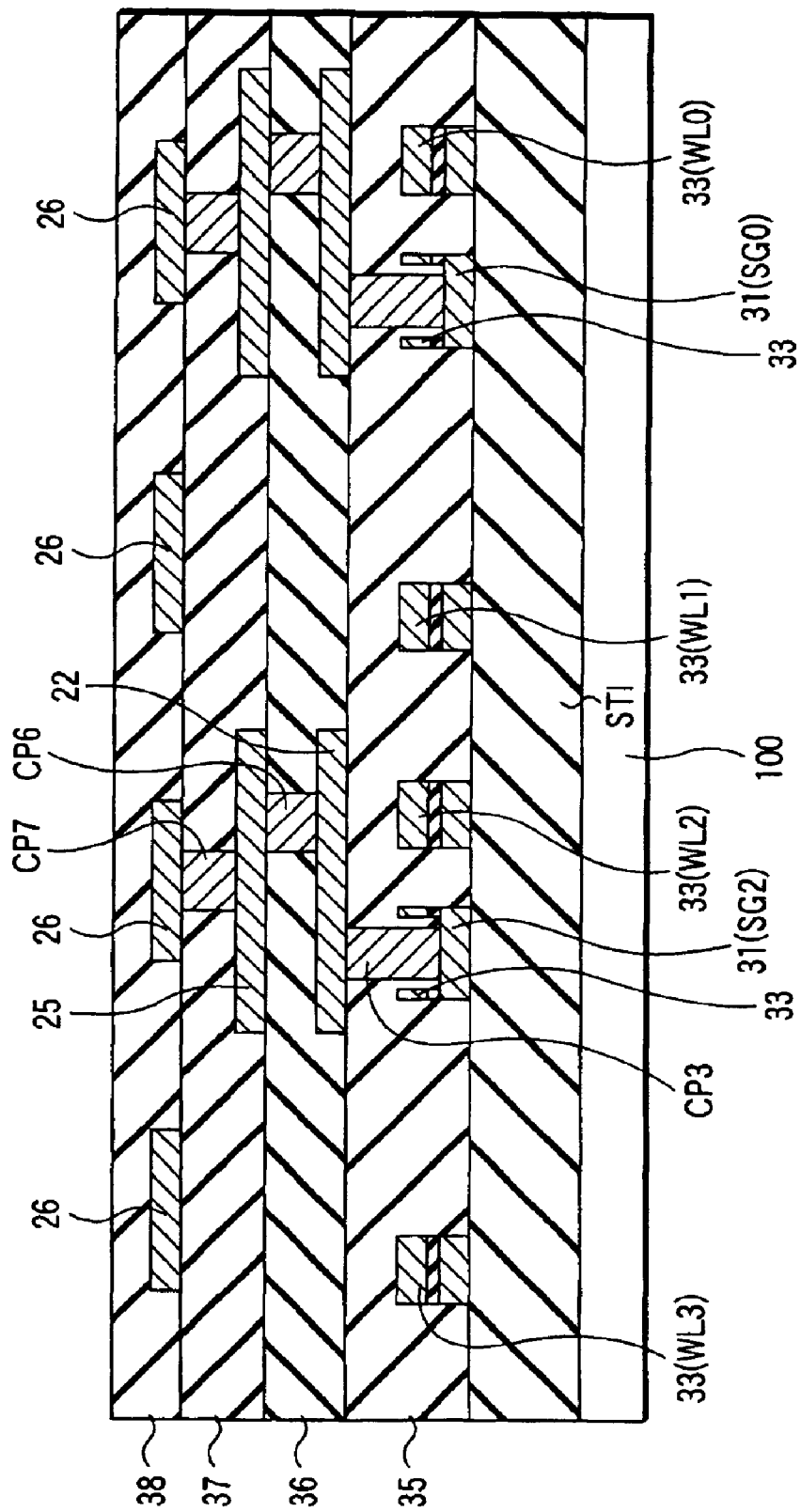
FIG. 14B is a sectional view taken along line 14B—14B of FIG. 14A.
Figure 14C:
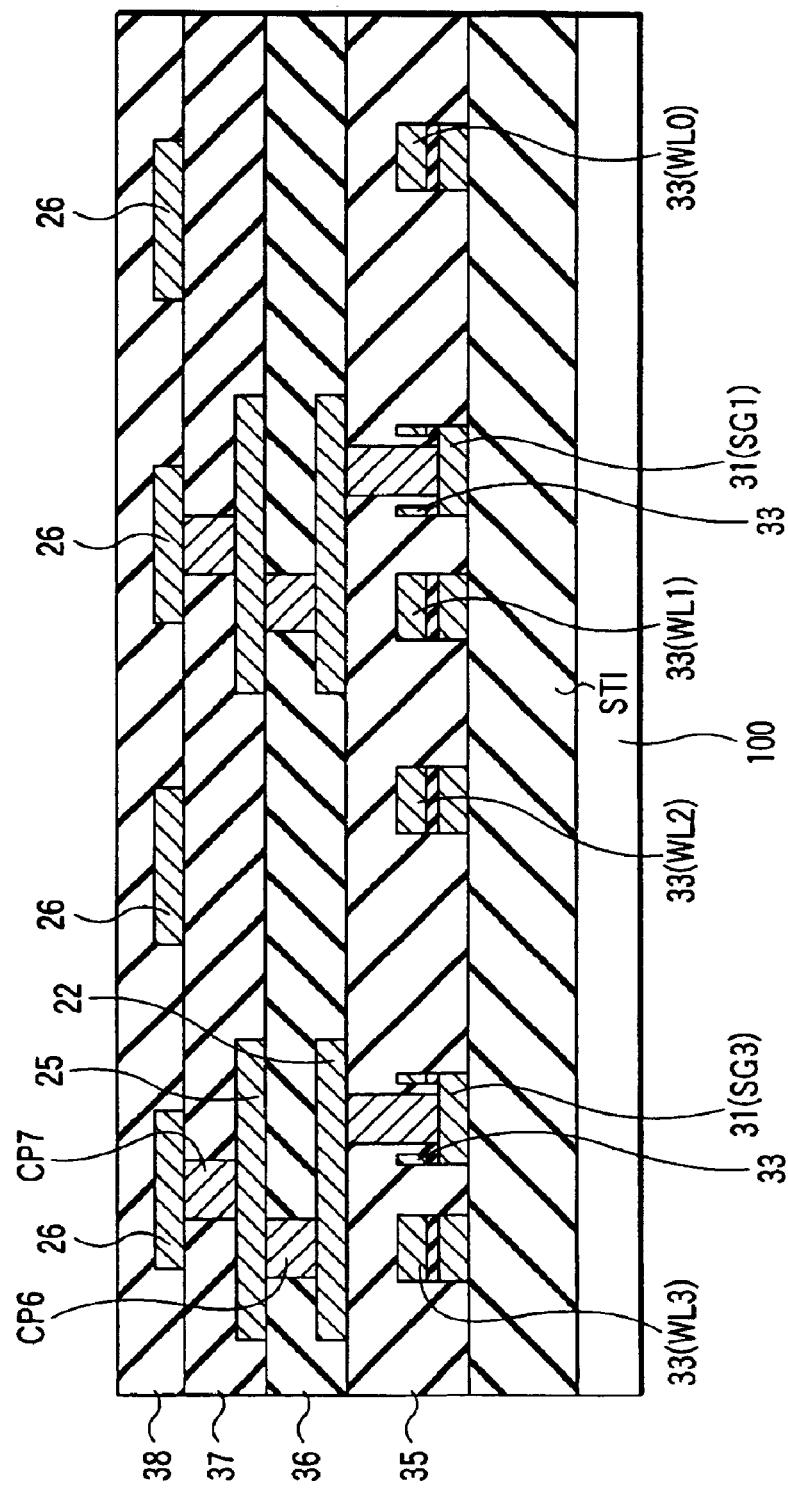
FIG. 14C is a sectional view taken along line 14C—14C of FIG. 14A.

The plane pattern of stitch regions may be such a pattern as shown in FIG. 14A. FIG. 14A is a plan view of a flash memory as in FIG. 12A. In FIG. 14A, only word lines, select gate lines, metal wiring layers 22, 25, and shunt wires 26 in the stitch regions are shown. FIG. 14B is a sectional view taken along line 14B—14B of FIG. 14A. FIG. 14C is a sectional view taken along line 14C—14C of FIG. 14A.

As shown in the figures, in one stitch region SA1, only some of the shunt wires 26 are connected to the shunt regions SA2 of select gate lines. In the shunt regions SA2, contact plugs CP3 are formed directly on the polycrystalline silicon layers 31, not on the polycrystalline silicon layers 33 as in the first to fifth embodiments. That is, part of the polycrystalline silicon layers 33 (and the inter-gate insulating films 32) have been removed. On the resulting regions, contact plugs CP3 are formed.

With the above configuration, the flash memory manufacturing processes can be simplified. This is because the process of removing the polycrystalline silicon layers 33 in the shunt regions SA2 can be carried out simultaneously with the process of forming transistors in the peripheral circuit region. In the peripheral circuit region, a MOS transistor has, for example, a single-layer gate structure. In this case, the process of forming a MOS transistor in the peripheral circuit region is as follows.

First, a gate insulating film 30, a polycrystalline silicon layer 31, and an inter-gate insulating film 32 are formed not only in the memory cell array region but also in the peripheral circuit region. Then, the gate insulating film 30, polycrystalline silicon layer 31, and inter-gate insulating film 32 in the peripheral circuit region are removed. Next, a gate insulating film for peripheral transistors is formed in the peripheral circuit region. Thereafter, a polycrystalline silicon layer 33 is formed in the memory cell array region and peripheral region. The polycrystalline silicon layer 33 serves as not only the control gates and select gates of memory cells but also the gate electrodes of peripheral transistors. Then, the polycrystalline silicon layers 31, 33, inter-gate insulating film 32, and gate insulating film 30 in the memory cell array region are patterned, which completes the multilayer gates of the memory cells. Next, the polycrystalline silicon layer 33 in the peripheral circuit region is patterned, which completes the gate electrodes of the peripheral transistors. At this time, the polycrystalline silicon layer 33 in the shunt region SA2 in the memory cell array region can also be patterned simultaneously. Therefore, the shunt region SA2 can be formed without an increase in the number of manufacturing processes.

A contact hole is made by removing the polycrystalline silicon layer 33 in the shunt region SA2 in such a manner that the hole fits in the pattern of the polycrystalline silicon layer 33. Use of such a layout makes the polycrystalline silicon layer 33 to be removed uniform in film thickness. Thus, it is possible to allow a sufficient processing margin in patterning the polycrystalline silicon layer 33. Of course, the control gates and select gates of the memory cells and the gate electrodes in the peripheral circuit region may be formed in separate processes. Even in this case, making the film thicknesses of the control gates and select gates and the gate electrodes equal enables the patterning process to be simplified.

To fit the contact hole made by removing the polycrystalline silicon layer 33 in the shunt region SA2 in the pattern of the polycrystalline silicon layer 33, the shunt region SA2 may be made that much larger. In this case, since the distance between adjacent select gates decreases, there is a possibility that the select gate lines will be short-circuited.

With the configuration shown in FIGS. 14A to 14C, the select gate lines adjacent to the shunt region SA2 are cut off in the stitch region SA1. The regions where the select gate lines are cut off are empty regions. Therefore, the short-circuiting of the select gate lines can be suppressed. In this case, the polycrystalline silicon layers 31 forming part of the select gate lines are cut off every other stitch region SA1. This does not become a problem, since the individual polycrystalline silicon layers 31 are connected to one another electrically by the metal wiring layers 26.

Figure 14D:
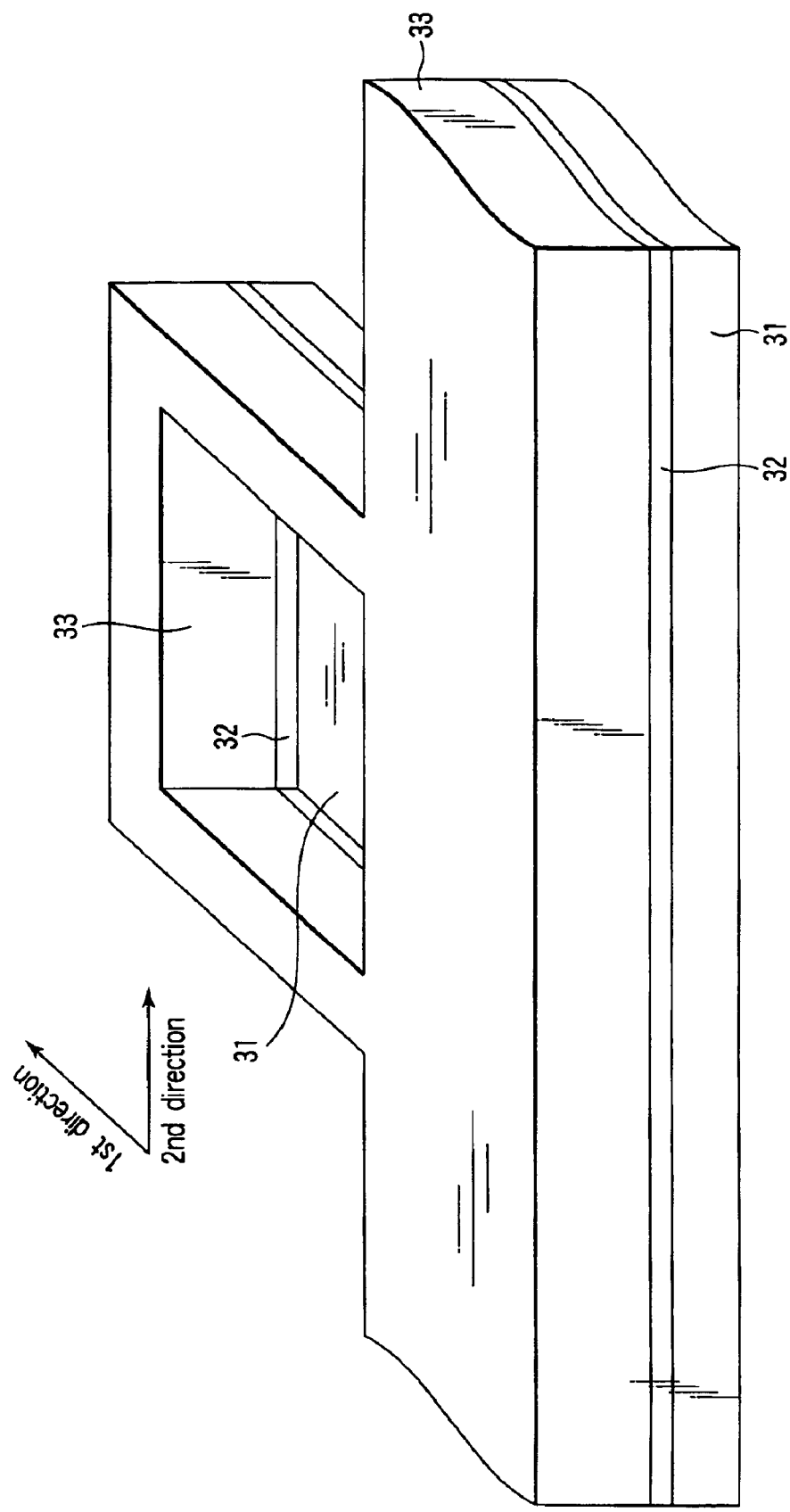
FIG. 14D is a perspective view of a stitch region in FIG. 14A.

As described above, part of the polycrystalline silicon layer 33 is removed in the shunt region SA2. Then, the contact plug CP3 is formed there. This makes it unnecessary to carry out the process of removing the inter-gate insulating film 32 explained in the first to fifth embodiments. As a result, the manufacturing processes can be simplified. FIG. 14D is a perspective view of the shunt region SA2.

As shown in FIG. 14D, in the shunt region SA2, the polycrystalline silicon layer 33 and inter-gate insulating film 32 are removed in such a manner that they are dug out, with the polycrystalline silicon layer 33 being exposed. Then, a contact plug CP3 is formed on the polycrystalline silicon layer 31. At this time, although the polycrystalline silicon layer 31 is in an electrically floating state, this does not particularly become a problem in terms of operation. Of course, the contact plug CP3 may be in contact with the polycrystalline silicon layer 31. Furthermore, tungsten silicide or cobalt silicide may be formed on the polycrystalline silicon layer 33 in the memory cell array region and the gate electrodes of the peripheral transistors. At this time, a Salicide (Self-Aligned Silicide) process can be used. Providing a silicide layer enables the wiring resistance to be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells each of which includes a first MOS transistor with a charge accumulation layer and a control gate and a second MOS transistor having one end of its current path connected to one end of a current path of the first MOS transistor;
   a memory cell array which has the memory cells arranged in a matrix in such a manner that the memory cells adjoining in the column direction share the other ends of the current paths of the first MOS transistors or the other ends of the current paths of the second MOS transistors;
   bit lines each of which connects commonly the other ends of the current paths of the first MOS transistors of the memory cells in the same column;
   word lines each of which is formed by connecting commonly the control gates of the first MOS transistors of the memory cells in the same row;
   select gate lines each of which is formed by connecting commonly the gates of the second MOS transistors of the memory cells in the same row;
   a column decoder which selects any one of the bit lines;
   a first row decoder which selects any one of the word lines;
   a second row decoder which selects any one of the select gate lines; and
   first metal wiring layers which are provided for every select gate lines, each of which is formed in the row direction so as to pass through almost the central part of the memory cells, is connected electrically to the corresponding one of the select gate lines, and transmits a row select signal for the second row decoder to select the select gate line.

2. The semiconductor memory device according to claim 1, wherein each of the first metal wiring layers is formed above a region between the central part of the select gate line and the central part of the word line.

3. The semiconductor memory device according to claim 1, further comprising:
   first contact plugs which are connected to the gates of the second MOS transistors;
   second metal wiring layers which are provided for every first contact plugs and are connected electrically to the first contact plugs; and
   second contact plugs each of which is formed on a region of the second wiring layer between the central part of the select gate line and the central part of the word line and is connected to the first metal wiring layer.

4. The semiconductor memory device according to claim 3, wherein each of the second metal wiring layers is extended from the upper region of the gate of the second MOS transistor connected to the corresponding one of the first contact plugs toward the upper region of the control gate of the first MOS transistor connected to the second MOS transistor.

5. The semiconductor memory device according to claim 3, wherein the memory cell array includes:
   a plurality of first regions each of which includes two or more of the memory cell columns; and
   second regions each of which is provided between the first regions adjacent to each other,
   the second metal wiring layers and the first and second contact plugs are formed in the second regions, and
   the select gate line is connected to the second metal wiring layers in the second region.

6. The semiconductor memory device according to claim 5, further comprising:
   third contact plugs each of which is connected to the other ends of the current paths of the first MOS transistors in the first region;
   third metal wiring layers which are provided for every third contact plugs and are connected to the third contact plugs; and
   fourth contact plugs which connect the third metal wiring layers to the bit lines, wherein
   the second metal wiring layers have almost the same width in the row direction as the third metal wiring layers.

7. The semiconductor memory device according to claim 5, further comprising:
   a source line which connects commonly the other ends of the current paths of the second MOS transistors; and
   fourth metal wiring layers which are formed in the column direction at a level higher than the source line and are connected to the source line by fifth contact plugs, wherein
   the source line includes first wiring regions each of which connects commonly the other ends of the current paths of the second MOS transistors of two or more of the memory cells in the same row and a second wiring region which connects the first wiring regions in the column direction,
   each of the first regions includes a third region which includes one of the memory cell columns,
   the second wiring region of the source line and the third metal wiring layer are formed in the third region, and
   the source line is connected to the third metal wiring layer in the third region.

8. The semiconductor memory device according to claim 7, wherein the fourth metal wiring layers are located at the same level as the bit lines.

9. The semiconductor memory device according to claim 7, wherein the fourth metal wiring layers have the same width as the bit lines.

10. The semiconductor memory device according to claim 7, wherein the first wiring regions of the source line adjacent to each other with the second region between them are isolated from one another in the row direction, and the first metal wiring layers adjacent to each other with the second region between them are connected commonly in the row direction via the second region.

11. The semiconductor memory device according to claim 1, further comprising:

a source line which connects commonly the other ends of the current paths of the second MOS transistors;

wherein the source line includes a first wiring region which connects commonly the other ends of the current paths of the second MOS transistors of two or more of the memory cells in the same row.

12. The semiconductor memory device according to claim 11, wherein the source line further includes a second wiring region which connects the first wiring layers in the column direction.

13. The semiconductor memory device according to claim 11, further comprising:

fourth wiring layers which are formed in the column direction at a level higher than the source line and are connected to the source line by fifth contact plugs.

14. A semiconductor memory device comprising:

a plurality of memory cells each of which includes a first MOS transistor which includes a charge accumulation layer and a control gate;

a memory cell array which has the memory cells arranged in a matrix;

bit lines each of which connects commonly the drain regions of the first MOS transistors of the memory cells in the same column;

word lines each of which is formed by connecting commonly the control gates of the first MOS transistors of the memory cells in the same row;

a source line which electrically connects commonly the source regions of the memory cells and which includes a first wiring region electrically connecting the source regions of the first MOS transistors of the memory cells in the same row commonly and a second wiring region connecting the first wiring regions in the column direction;

a column decoder which selects any one of the bit lines; and a first row decoder which selects any one of the word lines.

15. The semiconductor memory device according to claim 14, further comprising:

first metal wiring layers which are formed in the column direction at a level higher than the source line and are connected to the first and second wiring regions of the source line by first contact plugs.

16. The semiconductor memory device according to claim 15, wherein the first metal wiring layers are located at the same level as the bit lines.

17. The semiconductor memory device according to claim 15, wherein the first metal wiring layers have the same width as the bit lines.

18. The semiconductor memory device according to claim 15, wherein the memory cell array includes:

a plurality of first regions each of which includes a plurality of memory cell columns; and second regions each of which is provided between the first regions adjacent to each other and includes one of the memory cell columns, the second wiring regions of the source line and the first metal wiring layer are formed in the second region, and the source line is connected to the first metal wiring layer in the second region.

19. The semiconductor memory device according to claim 18, wherein each of the memory cells further includes a second MOS transistor having a drain connected to the source region of the first MOS transistor, and the source line connects commonly the source regions of the second MOS transistors, and the device further includes:

select gate lines each of which is formed by connecting commonly the gates of the second MOS transistors of the memory cells in the same row;

a second row decoder which selects any one of the select gate lines;

second metal wiring layers which are provided for every select gate lines and each of which is connected electrically to the corresponding one of the select gate lines and transmits a row select signal for the second row decoder to select the select gate line;

second contact plugs connected to the gates of the second MOS transistors;

third metal wiring layers which are provided for every second contact plugs and are connected electrically to the second contact plug; and third contact plugs which are formed on the third metal wiring layers so as to be connected to the second metal wiring layers, the first regions including third regions, the third metal wiring layers and the second and third contact plugs being formed in the third region, the select gate lines being connected to the second metal wiring layers in the third region.

20. The semiconductor memory device according to claim 19, wherein each of the third metal wiring layers is extended from the upper region of the gate of the second MOS transistor connected to the corresponding one of the second contact plugs toward the upper region of the control gate of the first MOS transistor connected to the second MOS transistor.

21. The semiconductor memory device according to claim 19, wherein each of the third contact plugs is formed on a region of the second wiring layer between the central part of the select gate line and the central part of the word line.

22. The semiconductor memory device according to claim 19, wherein the memory cells arranged in a matrix in the memory cell array are arranged in such a manner that the memory cells adjacent to one another in the column direction share the drain regions of the first MOS transistors or the source regions of the second MOS transistors, and each of the second metal wiring layers is formed above a region between the central part of the select gate line and the central part of the word line and passes through almost the central part of the memory cells.

23. The semiconductor memory device according to claim 19, wherein the first wiring regions of the source line adjacent to each other with the second region between them are isolated from one another in the row direction, and the second metal wiring layers adjacent to each other with the second region between them are connected commonly in the row direction via the second region.

24. The semiconductor memory device according to claim 18, further comprising:

fourth contact plugs which are connected to the drain regions of the first MOS transistors in the first regions;

fourth metal wiring layers which are provided for every fourth contact plugs and are connected to the fourth contact plugs; and fifth contact plugs which connect the fourth metal wiring layers to the bit lines, wherein the third metal wiring layers have almost the same width in the row direction as the fourth metal wiring layers.

25. The semiconductor memory device according to claim 14, wherein each of the memory cells further includes a second MOS transistor having a drain region connected to the source region of the first MOS transistor, the source line connects commonly the source regions of the second MOS transistors and the device further includes:

select gate lines each of which is formed by connecting commonly the gates of the second MOS transistors of the memory cells in the same row connected commonly;

a second row decoder which selects any one of the select gate lines; and first metal wiring layers which are provided for every select gate lines and each of which is connected electrically to the corresponding one of the select gate lines and transmits a row select signal for the second row decoder to select the select gate line.

26. The semiconductor memory device according to claim 25, further comprising:

first contact plugs connected to the gates of the second MOS transistors;

second metal wiring layers which are provided for every first contact plugs and are connected electrically to the first contact plugs; and second contact plugs which are formed on the second metal wiring layers and are connected to the first metal wiring layers.

27. The semiconductor memory device according to claim 26, wherein each of the second metal wiring layers is extended from the upper region of the gate of the second MOS transistor connected to the corresponding one of the first contact plugs toward the upper region of the control gate of the first MOS transistor connected to the second MOS transistor.

28. The semiconductor memory device according to claim 26, wherein each of the second contact plugs is formed on a region of the second wiring layer between the central part of the select gate line and the central part of the word line.

29. The semiconductor memory device according to claim 25, wherein the memory cells arranged in a matrix in the memory cell array are arranged in such a manner that the memory cells adjacent to one another in the column direction share the drain regions of the first MOS transistors or the source regions of the second MOS transistors, and each of the first metal wiring layers is formed above a region between the central part of the select gate line and the central part of the word line and passes through almost the central part of the memory cells.

30. The semiconductor memory device according to claim 25, wherein the first wiring regions of the source line adjacent to each other with the second region between them are isolated from one another in the row direction, and the second metal wiring layers adjacent to each other with the second region between them are connected commonly in the row direction via the second region.

* * * * *